US012573095B2

(12) United States Patent
Hsieh et al.

(10) Patent No.: US 12,573,095 B2
(45) Date of Patent: Mar. 10, 2026

(54) CROSS SUBTILE PREDICTION FOR BANDWIDTH COMPRESSION

(71) Applicant: QUALCOMM Incorporated, San Diego, CA (US)

(72) Inventors: Cheng-Teh Hsieh, Del Mar, CA (US); Venkata Meher Satchit Anand Kotra, Munich (DE); Hyung Joon Kim, San Diego, CA (US); Wei-Jung Chien, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 334 days.

(21) Appl. No.: 18/346,097

(22) Filed: Jun. 30, 2023

(65) Prior Publication Data

US 2025/0005799 A1 Jan. 2, 2025

(51) Int. Cl.
*G06T 9/00* (2006.01)
*H03M 7/30* (2006.01)

(52) U.S. Cl.
CPC ............. *G06T 9/00* (2013.01); *H03M 7/3077* (2013.01); *H03M 7/6011* (2013.01); *H03M 7/6023* (2013.01)

(58) Field of Classification Search
CPC ..... G06T 9/00; H03M 7/3077; H03M 7/6011; H03M 7/6023
USPC ....................................................... 375/240.1
See application file for complete search history.

(56) References Cited

U.S. PATENT DOCUMENTS

2017/0094274 A1 3/2017 Chien et al.
2017/0094292 A1 3/2017 Damudi et al.

FOREIGN PATENT DOCUMENTS

GB 2521117 A 6/2015

OTHER PUBLICATIONS

International Search Report and Written Opinion—PCT/US2024/026969—ISA/EPO—Aug. 14, 2024.
Yeo C., et al., "Mode-Dependent Coefficient Scanning for Intra Prediction Residual Coding", Joint Collaborative Team on Video Coding (JCT-VC) of ITU-T SG16 WP3 and ISO/IEC JTC1/SC29/WG11, (Motion Picture Expert Group OR ISO/IEC JTC1/SC29/WG11), 95. MPEG Meeting, 4th Meeting: Daegu, KR, Jan. 20, 2011-Jan. 28, 2011, JCTVC-D049, No. m18796, Jan. 21, 2011, pp. 1-7, XP030047366, Section 1 Introduction, Section 3 Proposed approach.

*Primary Examiner* — Nguyen T Truong
(74) *Attorney, Agent, or Firm* — Procopio, Cory, Hargreaves & Savitch LLP

(57) ABSTRACT

Aspects presented herein relate to methods and devices for data processing including an apparatus, e.g., a CPU. The apparatus may obtain an indication of a set of data subunits corresponding to at least one data unit. The apparatus may also arrange data for the set of data subunits into a first data order for the set of data subunits. Further, the apparatus may perform at least one of an encoding process or a decoding process on the data for each data subunit of the set of data subunits. The apparatus may also rearrange the data for the set of data subunits into the first data order for a first data subunit in the set of data subunits and into a second data order for at least one second data subunit in the set of data subunits, where the first data order is different from the second data order.

29 Claims, 11 Drawing Sheets

Figure 6:
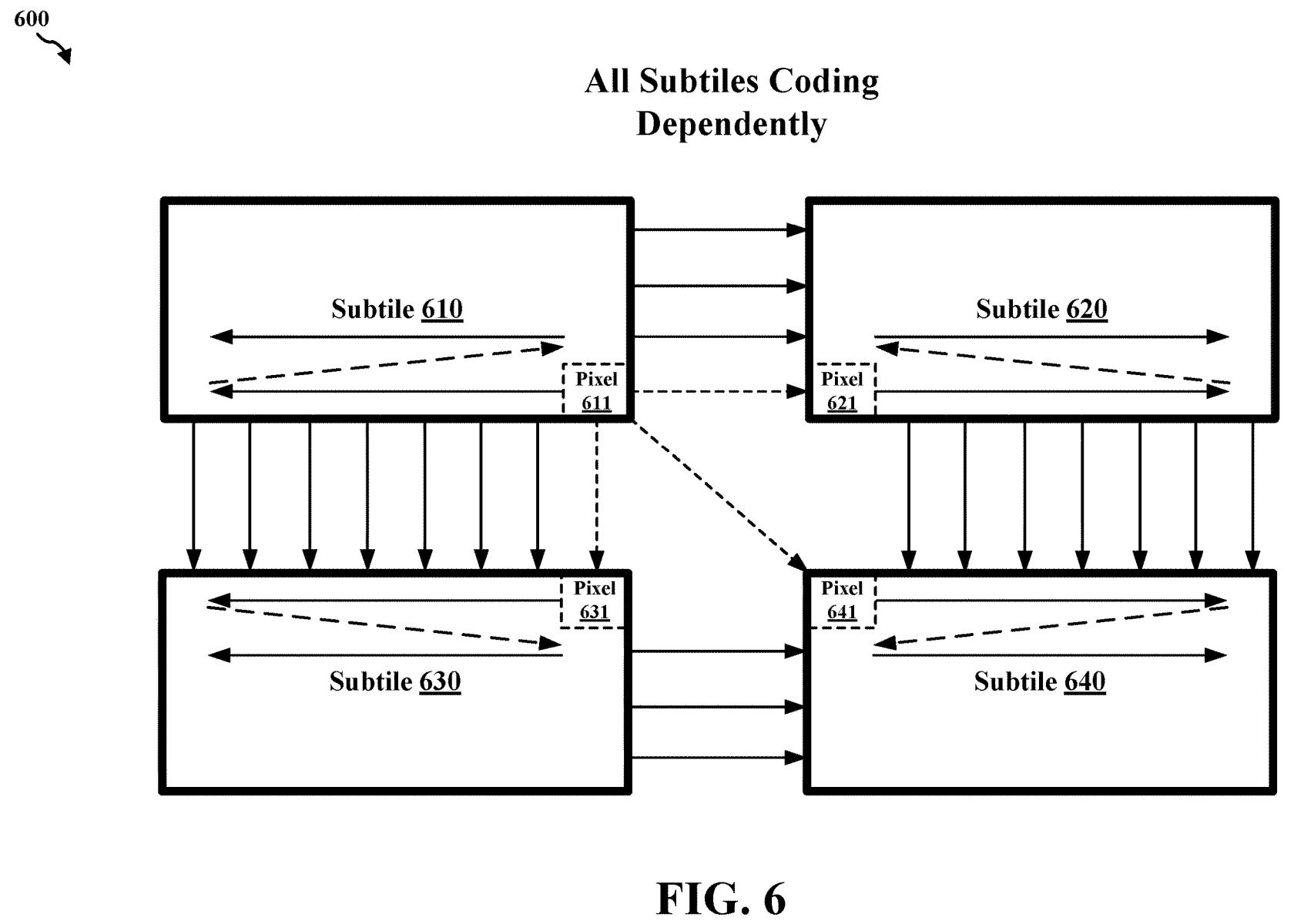

All Subtiles Coding Dependently

Subtile 620

Pixel 621

Subtile 640

Pixel 641

Subtile 610

Pixel 611

Subtile 630

Pixel 631

Top and Bottom Subtiles
Coding Dependently

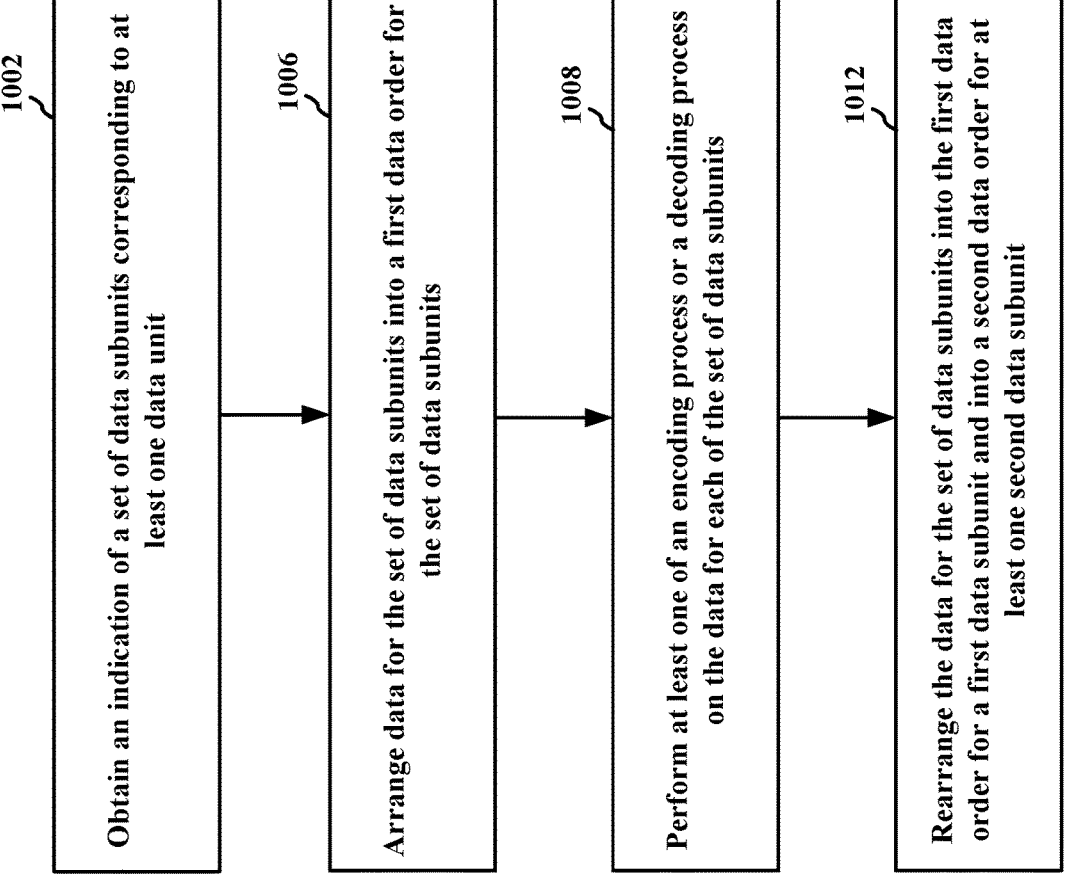

1002 — Obtain an indication of a set of data subunits corresponding to at least one data unit 1006 — Arrange data for the set of data subunits into a first data order for the set of data subunits 1008 — Perform at least one of an encoding process or a decoding process on the data for each of the set of data subunits 1012 — Rearrange the data for the set of data subunits into the first data order for a first data subunit and into a second data order for at least one second data subunit

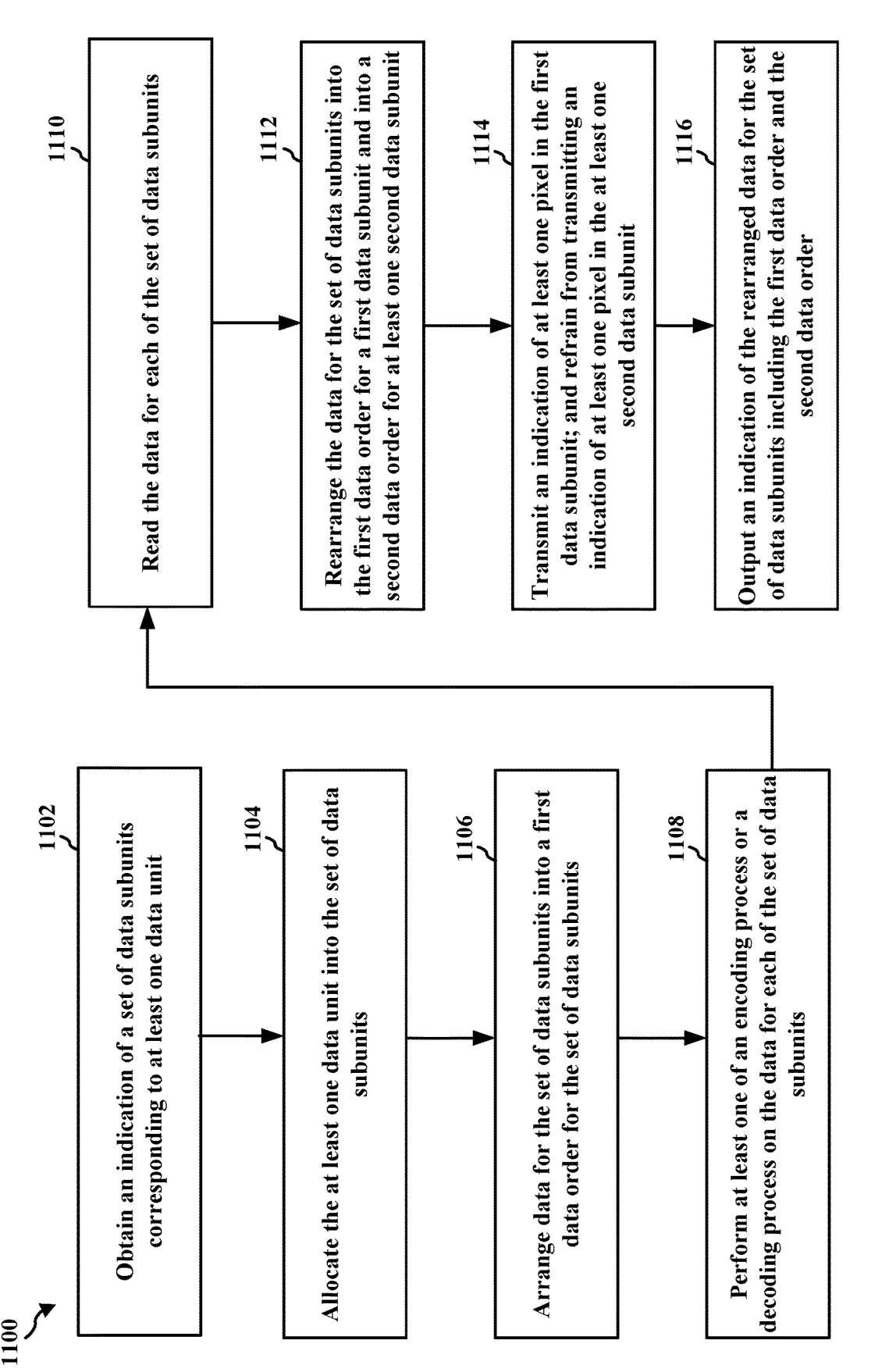

1100

1102 — Obtain an indication of a set of data subunits corresponding to at least one data unit 1104 — Allocate the at least one data unit into the set of data subunits 1106 — Arrange data for the set of data subunits into a first data order for the set of data subunits 1108 — Perform at least one of an encoding process or a decoding process on the data for each of the set of data subunits 1110 — Read the data for each of the set of data subunits 1112 — Rearrange the data for the set of data subunits into the first data order for a first data subunit and into a second data order for at least one second data subunit 1114 — Transmit an indication of at least one pixel in the first data subunit; and refrain from transmitting an indication of at least one pixel in the at least one second data subunit 1116 — Output an indication of the rearranged data for the set of data subunits including the first data order and the second data order

FIG. 11

CROSS SUBTILE PREDICTION FOR BANDWIDTH COMPRESSION

TECHNICAL FIELD

The present disclosure relates generally to processing systems and, more particularly, to one or more techniques for graphics and data processing.

INTRODUCTION

Computing devices often perform graphics and/or display processing (e.g., utilizing a graphics processing unit (GPU), a central processing unit (CPU), a display processor, etc.) to render and display visual content. Such computing devices may include, for example, computer workstations, mobile phones such as smartphones, embedded systems, personal computers, tablet computers, and video game consoles. GPUs are configured to execute a graphics processing pipeline that includes one or more processing stages, which operate together to execute graphics processing commands and output a frame. A central processing unit (CPU) may control the operation of the GPU by issuing one or more graphics processing commands to the GPU. Modern day CPUs are typically capable of executing multiple applications concurrently, each of which may need to utilize the GPU during execution. A display processor is configured to convert digital information received from a CPU to analog values and may issue commands to a display panel for displaying the visual content. A device that provides content for visual presentation on a display may utilize a GPU and/or a display processor.

A GPU of a device may be configured to perform the processes in a graphics processing pipeline. Further, a display processor or display processing unit (DPU) may be configured to perform the processes of display processing. However, with the advent of wireless communication and smaller, handheld devices, there has developed an increased need for improved graphics or data processing.

BRIEF SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. The apparatus may be a central processing unit (CPU), a display processing unit (DPU), a graphics processing unit (GPU), or any apparatus that may perform display processing. The apparatus may obtain an indication of a set of data subunits corresponding to at least one data unit, where the set of data subunits is associated with a bandwidth compression process. The apparatus may also allocate the at least one data unit into the set of data subunits, where the allocation of the at least one data unit into the set of data subunits is based on the obtainment of the indication of the set of data subunits corresponding to the at least one data unit. Additionally, the apparatus may arrange data for the set of data subunits into a first data order for the set of data subunits. The apparatus may also perform, based on the first data order, at least one of an encoding process on the data for each data subunit of the set of data subunits or a decoding process on the data for each data subunit of the set of data subunits. Moreover, the apparatus may read, based on at least one of the encoding process or the decoding process, the data for each data subunit of the set of data subunits. The apparatus may also rearrange the data for the set of data subunits into the first data order for a first data subunit in the set of data subunits and into a second data order for at least one second data subunit in the set of data subunits, where the first data order is different from the second data order. The apparatus may also transmit an indication of at least one pixel in the first data subunit; and refrain from transmitting an indication of the at least one pixel in each of the at least one second data subunit. Further, the apparatus may output an indication of the rearranged data for the set of data subunits including the first data order for the first data subunit and the second data order for the at least one second data subunit.

The details of one or more examples of the disclosure are set forth in the accompanying drawings and the description below. Other features, objects, and advantages of the disclosure will be apparent from the description and drawings, and from the claims.

BRIEF DESCRIPTION OF DRAWINGS

FIG. 3 illustrates an example display framework including a display processor and a display.

FIG. 6 is a diagram illustrating an example pixel prediction process.

FIG. 10 is a flowchart of an example method of data processing.

FIG. 11 is a flowchart of an example method of data processing.

DETAILED DESCRIPTION

Figure 1:
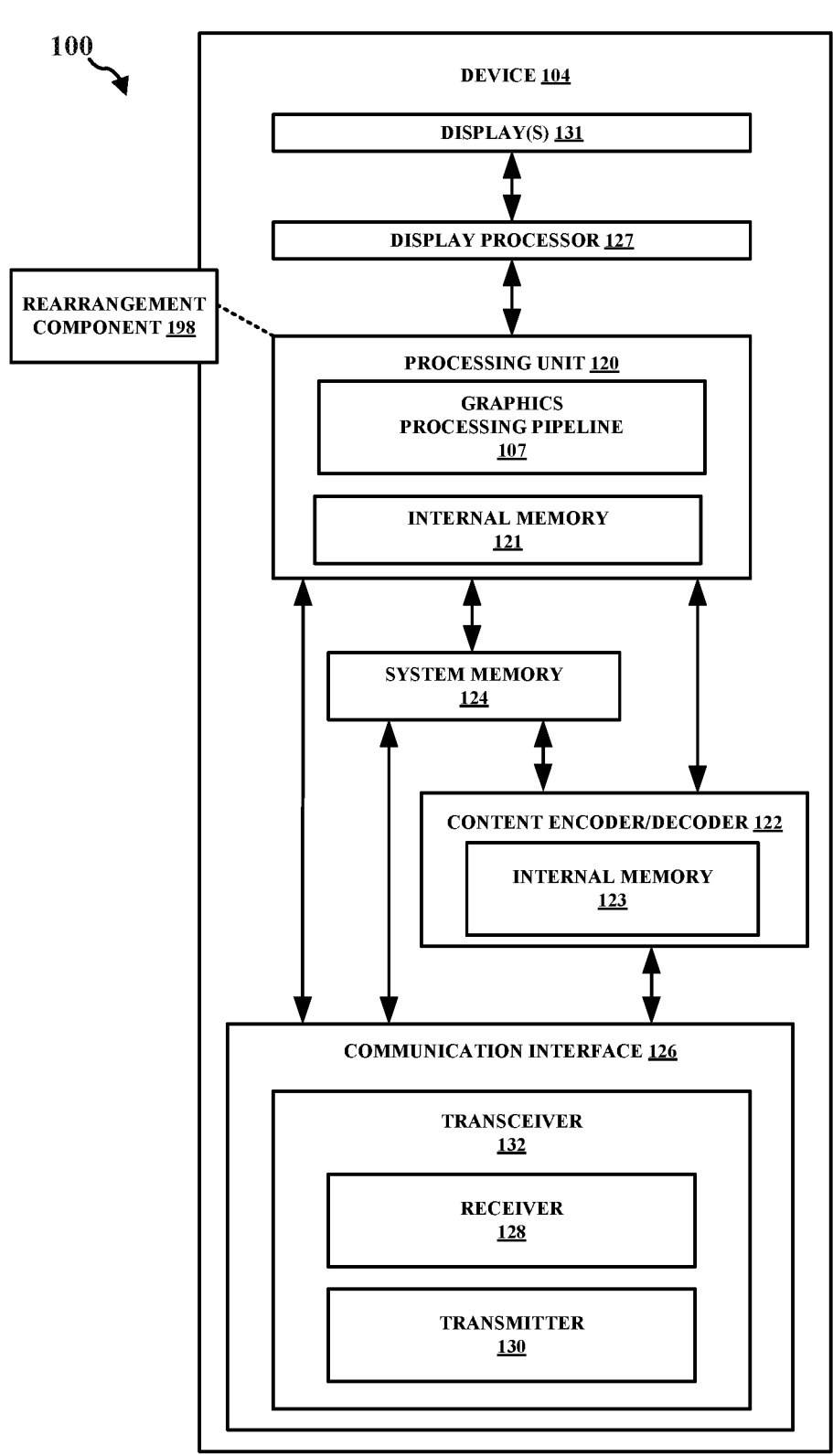
FIG. 1 is a block diagram that illustrates an example content generation system.

Subtile-based hardware parallel encoding and decoding may lead to a higher throughput. In current bandwidth compressions, for the purpose of efficient hardware parallel encoding and decoding, a tile may be divided into multiple subtiles. Also, self-contained pixel prediction may lead to lower latency, which may be used for certain types of subtile processing. This may result in no prediction dependency between subtiles, which may result in no subtiles including decoding latency. That is, for the hardware encoding or decoding, no neighboring subtile pixels may be needed for current subtile processing. However, for the pixels on the top row and left column of all subtiles, the corresponding predictors may be the first pixel of that subtile, which are combined with the immediate left or top neighboring of the current pixel to be predicted. Additionally, while the aforementioned parallel encoding and decoding may achieve a low latency and high throughput, it may be lacking in coding efficiency. For instance, in order to achieve subtiles independent and parallel encoding/decoding processing (i.e., to obtain low latency and high throughput), there may be a tradeoff of coding efficiency. That is, a lack of utilizing certain neighboring pixels with a higher correlation (e.g., neighboring pixels for a subtile's boundary (top row and left column)) during the prediction process may result in less coding efficiency for the bandwidth compression process. For instance, for boundary pixels (e.g., top-left pixels), the corresponding higher-correlation pixels may not be used during the prediction process. Accordingly, some types of bandwidth compressions with parallel independent encoding and decoding may result in a reduced coding efficiency, as certain neighboring pixels of a pixel may not be used to predict the pixel. Further, parallel independent encoding and decoding may result in needing to wait for all subtiles to finish encoding/decoding before the prediction process can finish, which may result in an increased latency. Aspects of the present disclosure may increase the coding efficiency for bandwidth compressions that utilize encoding/decoding for subtile and pixel prediction. For instance, aspects presented herein may utilize certain neighboring pixels (e.g., high correlation pixels) of a pixel during the prediction process in order to more efficiently predict the pixel. Additionally, aspects presented herein may reduce the amount of latency during encoding/decoding of a subtile and pixel prediction process. For example, aspects presented herein may utilize coding/decoding for subtiles that is dependent on neighboring subtiles and pixels in order to predict the subtiles/pixels in a more efficient manner. By doing so, aspects presented herein may not need to wait for all subtiles/pixels to finish encoding/decoding before the prediction process can finish. That is, aspects presented herein may utilize some of the subtile/pixel predictions from neighboring subtiles/pixels in order to reduce the amount of time spent during the subtile/pixel prediction process.

Aspects presented herein may include a number of benefits or advantages. For instance, aspects presented herein may increase the coding efficiency of compression (e.g., especially for lossless compression). Further, aspects presented herein may maintain a high-throughput and a low-latency for decoding processing. Aspects presented herein may also utilize an input/output (I/O) re-ordering for decoding processing. Additionally, aspects of the present disclosure may increase the coding efficiency for bandwidth compressions that utilize encoding/decoding for subtile and pixel prediction. For example, aspects presented herein may utilize certain neighboring pixels (e.g., high correlation pixels) of a pixel during the prediction process in order to more efficiently predict the pixel. Also, aspects presented herein may reduce the amount of latency during encoding/decoding of a subtile and pixel prediction process. For instance, aspects presented herein may utilize coding/decoding for subtiles that is dependent on neighboring subtiles and pixels in order to predict the subtiles/pixels in a more efficient manner. That is, aspects presented herein may not need to wait for all subtiles/pixels to finish encoding/decoding before the prediction process can finish. Aspects presented herein may utilize some of the subtile/pixel predictions from neighboring subtiles/pixels in order to reduce the amount of time spent during the subtile/pixel prediction process. Various aspects of systems, apparatuses, computer program products, and methods are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of this disclosure to those skilled in the art. Based on the teachings herein one skilled in the art should appreciate that the scope of this disclosure is intended to cover any aspect of the systems, apparatuses, computer program products, and methods disclosed herein, whether implemented independently of, or combined with, other aspects of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. Any aspect disclosed herein may be embodied by one or more elements of a claim.

Although various aspects are described herein, many variations and permutations of these aspects fall within the scope of this disclosure. Although some potential benefits and advantages of aspects of this disclosure are mentioned, the scope of this disclosure is not intended to be limited to particular benefits, uses, or objectives. Rather, aspects of this disclosure are intended to be broadly applicable to different wireless technologies, system configurations, networks, and transmission protocols, some of which are illustrated by way of example in the figures and in the following description. The detailed description and drawings are merely illustrative of this disclosure rather than limiting, the scope of this disclosure being defined by the appended claims and equivalents thereof.

Several aspects are presented with reference to various apparatus and methods. These apparatus and methods are described in the following detailed description and illustrated in the accompanying drawings by various blocks, components, circuits, processes, algorithms, and the like (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors (which may also be referred to as processing units). Examples of processors include microprocessors, microcontrollers, graphics processing units (GPUs), general purpose GPUs (GPGPUs), central processing units (CPUs), application processors, digital signal processors (DSPs), reduced instruction set computing (RISC) processors, systems-on-chip (SOC), baseband processors, application specific integrated circuits (ASICs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software may be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise. The term application may refer to software. As described herein, one or more techniques may refer to an application, i.e., software, being configured to perform one or more functions. In such examples, the application may be stored on a memory, e.g., on-chip memory of a processor, system memory, or any other memory. Hardware described herein, such as a processor may be configured to execute the application. For example, the application may be described as including code that, when executed by the hardware, causes the hardware to perform one or more techniques described herein. As an example, the hardware may access the code from a memory and execute the code accessed from the memory to perform one or more techniques described herein. In some examples, components are identified in this disclosure. In such examples, the components may be hardware, software, or a combination thereof. The components may be separate components or sub-components of a single component.

Accordingly, in one or more examples described herein, the functions described may be implemented in hardware, software, or any combination thereof. If implemented in software, the functions may be stored on or encoded as one or more instructions or code on a computer-readable medium. Computer-readable media includes computer storage media. Storage media may be any available media that may be accessed by a computer. By way of example, and not limitation, such computer-readable media may comprise a random access memory (RAM), a read-only memory (ROM), an electrically erasable programmable ROM (EE-PROM), optical disk storage, magnetic disk storage, other magnetic storage devices, combinations of the aforementioned types of computer-readable media, or any other medium that may be used to store computer executable code in the form of instructions or data structures that may be accessed by a computer.

In general, this disclosure describes techniques for having a graphics processing pipeline in a single device or multiple devices, improving the rendering of graphical content, and/or reducing the load of a processing unit, i.e., any processing unit configured to perform one or more techniques described herein, such as a GPU. For example, this disclosure describes techniques for graphics processing in any device that utilizes graphics processing. Other example benefits are described throughout this disclosure.

As used herein, instances of the term "content" may refer to "graphical content," "image," and vice versa. This is true regardless of whether the terms are being used as an adjective, noun, or other parts of speech. In some examples, as used herein, the term "graphical content" may refer to a content produced by one or more processes of a graphics processing pipeline. In some examples, as used herein, the term "graphical content" may refer to a content produced by a processing unit configured to perform graphics processing. In some examples, as used herein, the term "graphical content" may refer to a content produced by a graphics processing unit.

In some examples, as used herein, the term "display content" may refer to content generated by a processing unit configured to perform displaying processing. In some examples, as used herein, the term "display content" may refer to content generated by a display processing unit. Graphical content may be processed to become display content. For example, a graphics processing unit may output graphical content, such as a frame, to a buffer (which may be referred to as a framebuffer). A display processing unit may read the graphical content, such as one or more frames from the buffer, and perform one or more display processing techniques thereon to generate display content. For example, a display processing unit may be configured to perform composition on one or more rendered layers to generate a frame. As another example, a display processing unit may be configured to compose, blend, or otherwise combine two or more layers together into a single frame. A display processing unit may be configured to perform scaling, e.g., upscaling or downscaling, on a frame. In some examples, a frame may refer to a layer. In other examples, a frame may refer to two or more layers that have already been blended together to form the frame, i.e., the frame includes two or more layers, and the frame that includes two or more layers may subsequently be blended.

FIG. 1 is a block diagram that illustrates an example content generation system 100 configured to implement one or more techniques of this disclosure. The content generation system 100 includes a device 104. The device 104 may include one or more components or circuits for performing various functions described herein. In some examples, one or more components of the device 104 may be components of an SOC. The device 104 may include one or more components configured to perform one or more techniques of this disclosure. In the example shown, the device 104 may include a processing unit 120, a content encoder/decoder 122, and a system memory 124. In some aspects, the device 104 may include a number of components, e.g., a communication interface 126, a transceiver 132, a receiver 128, a transmitter 130, a display processor 127, and one or more displays 131. Reference to the display 131 may refer to the one or more displays 131. For example, the display 131 may include a single display or multiple displays. The display 131 may include a first display and a second display. The first display may be a left-eye display and the second display may be a right-eye display. In some examples, the first and second display may receive different frames for presentment thereon. In other examples, the first and second display may receive the same frames for presentment thereon. In further examples, the results of the graphics processing may not be displayed on the device, e.g., the first and second display may not receive any frames for presentment thereon. Instead, the frames or graphics processing results may be transferred to another device. In some aspects, this may be referred to as split-rendering.

The processing unit 120 may include an internal memory 121. The processing unit 120 may be configured to perform graphics processing, such as in a graphics processing pipeline 107. The content encoder/decoder 122 may include an internal memory 123. In some examples, the device 104 may include a display processor, such as the display processor 127, to perform one or more display processing techniques on one or more frames generated by the processing unit 120 before presentment by the one or more displays 131. The display processor 127 may be configured to perform display processing. For example, the display processor 127 may be configured to perform one or more display processing techniques on one or more frames generated by the processing unit 120. The one or more displays 131 may be configured to display or otherwise present frames processed by the display processor 127. In some examples, the one or more displays 131 may include one or more of: a liquid crystal display (LCD), a plasma display, an organic light emitting diode (OLED) display, a projection display device, an augmented reality display device, a virtual reality display device, a head-mounted display, or any other type of display device.

Memory external to the processing unit 120 and the content encoder/decoder 122, such as system memory 124, may be accessible to the processing unit 120 and the content encoder/decoder 122. For example, the processing unit 120 and the content encoder/decoder 122 may be configured to read from and/or write to external memory, such as the system memory 124. The processing unit 120 and the content encoder/decoder 122 may be communicatively coupled to the system memory 124 over a bus. In some examples, the processing unit 120 and the content encoder/decoder 122 may be communicatively coupled to each other over the bus or a different connection.

The content encoder/decoder 122 may be configured to receive graphical content from any source, such as the system memory 124 and/or the communication interface 126. The system memory 124 may be configured to store received encoded or decoded graphical content. The content encoder/decoder 122 may be configured to receive encoded or decoded graphical content, e.g., from the system memory 124 and/or the communication interface 126, in the form of encoded pixel data. The content encoder/decoder 122 may be configured to encode or decode any graphical content.

The internal memory 121 or the system memory 124 may include one or more volatile or non-volatile memories or storage devices. In some examples, internal memory 121 or the system memory 124 may include RAM, SRAM, DRAM, erasable programmable ROM (EPROM), electrically erasable programmable ROM (EEPROM), flash memory, a magnetic data media or an optical storage media, or any other type of memory.

The internal memory 121 or the system memory 124 may be a non-transitory storage medium according to some examples. The term "non-transitory" may indicate that the storage medium is not embodied in a carrier wave or a propagated signal. However, the term "non-transitory" should not be interpreted to mean that internal memory 121 or the system memory 124 is non-movable or that its contents are static. As one example, the system memory 124 may be removed from the device 104 and moved to another device. As another example, the system memory 124 may not be removable from the device 104.

The processing unit 120 may be a central processing unit (CPU), a graphics processing unit (GPU), a general purpose GPU (GPGPU), or any other processing unit that may be configured to perform graphics processing. In some examples, the processing unit 120 may be integrated into a motherboard of the device 104. In some examples, the processing unit 120 may be present on a graphics card that is installed in a port in a motherboard of the device 104, or may be otherwise incorporated within a peripheral device configured to interoperate with the device 104. The processing unit 120 may include one or more processors, such as one or more microprocessors, GPUs, application specific integrated circuits (ASICs), field programmable gate arrays (FPGAs), arithmetic logic units (ALUs), digital signal processors (DSPs), discrete logic, software, hardware, firmware, other equivalent integrated or discrete logic circuitry, or any combinations thereof. If the techniques are implemented partially in software, the processing unit 120 may store instructions for the software in a suitable, non-transitory computer-readable storage medium, e.g., internal memory 121, and may execute the instructions in hardware using one or more processors to perform the techniques of this disclosure. Any of the foregoing, including hardware, software, a combination of hardware and software, etc., may be considered to be one or more processors.

The content encoder/decoder 122 may be any processing unit configured to perform content decoding. In some examples, the content encoder/decoder 122 may be integrated into a motherboard of the device 104. The content encoder/decoder 122 may include one or more processors, such as one or more microprocessors, application specific integrated circuits (ASICs), field programmable gate arrays (FPGAs), arithmetic logic units (ALUs), digital signal processors (DSPs), video processors, discrete logic, software, hardware, firmware, other equivalent integrated or discrete logic circuitry, or any combinations thereof. If the techniques are implemented partially in software, the content encoder/decoder 122 may store instructions for the software in a suitable, non-transitory computer-readable storage medium, e.g., internal memory 123, and may execute the instructions in hardware using one or more processors to perform the techniques of this disclosure. Any of the foregoing, including hardware, software, a combination of hardware and software, etc., may be considered to be one or more processors.

In some aspects, the content generation system 100 may include a communication interface 126. The communication interface 126 may include a receiver 128 and a transmitter 130. The receiver 128 may be configured to perform any receiving function described herein with respect to the device 104. Additionally, the receiver 128 may be configured to receive information, e.g., eye or head position information, rendering commands, or location information, from another device. The transmitter 130 may be configured to perform any transmitting function described herein with respect to the device 104. For example, the transmitter 130 may be configured to transmit information to another device, which may include a request for content. The receiver 128 and the transmitter 130 may be combined into a transceiver 132. In such examples, the transceiver 132 may be configured to perform any receiving function and/or transmitting function described herein with respect to the device 104.

Referring again to FIG. 1, in certain aspects, the display processor 127 may include a rearrangement component 198 configured to obtain an indication of a set of data subunits corresponding to at least one data unit, where the set of data subunits is associated with a bandwidth compression process. The rearrangement component 198 may also be configured to allocate the at least one data unit into the set of data subunits, where the allocation of the at least one data unit into the set of data subunits is based on the obtainment of the indication of the set of data subunits corresponding to the at least one data unit. The rearrangement component 198 may also be configured to arrange data for the set of data subunits into a first data order for the set of data subunits. The rearrangement component 198 may also be configured to perform, based on the first data order, at least one of an encoding process on the data for each data subunit of the set of data subunits or a decoding process on the data for each data subunit of the set of data subunits. The rearrangement component 198 may also be configured to read, based on at least one of the encoding process or the decoding process, the data for each data subunit of the set of data subunits. The rearrangement component 198 may also be configured to rearrange the data for the set of data subunits into the first data order for a first data subunit in the set of data subunits and into a second data order for at least one second data subunit in the set of data subunits, where the first data order is different from the second data order. The rearrangement component 198 may also be configured to transmit an indication of at least one pixel in the first data subunit; and refrain from transmitting an indication of the at least one pixel in each of the at least one second data subunit. The rearrangement component 198 may also be configured to output an indication of the rearranged data for the set of data subunits including the first data order for the first data subunit and the second data order for the at least one second data subunit. Although the following description may be focused on data processing, the concepts described herein may be applicable to other similar processing techniques.

As described herein, a device, such as the device 104, may refer to any device, apparatus, or system configured to perform one or more techniques described herein. For example, a device may be a server, a base station, user equipment, a client device, a station, an access point, a computer, e.g., a personal computer, a desktop computer, a laptop computer, a tablet computer, a computer workstation, or a mainframe computer, an end product, an apparatus, a phone, a smart phone, a server, a video game platform or console, a handheld device, e.g., a portable video game device or a personal digital assistant (PDA), a wearable computing device, e.g., a smart watch, an augmented reality device, or a virtual reality device, a non-wearable device, a display or display device, a television, a television set-top box, an intermediate network device, a digital media player, a video streaming device, a content streaming device, an in-car computer, any mobile device, any device configured to generate graphical content, or any device configured to perform one or more techniques described herein. Processes herein may be described as performed by a particular component (e.g., a GPU), but, in further embodiments, may be performed using other components (e.g., a CPU), consistent with disclosed embodiments.

GPUs may process multiple types of data or data packets in a GPU pipeline. For instance, in some aspects, a GPU may process two types of data or data packets, e.g., context register packets and draw call data. A context register packet may be a set of global state information, e.g., information regarding a global register, shading program, or constant data, which may regulate how a graphics context will be processed. For example, context register packets may include information regarding a color format. In some aspects of context register packets, there may be a bit that indicates which workload belongs to a context register. Also, there may be multiple functions or programming running at the same time and/or in parallel. For example, functions or programming may describe a certain operation, e.g., the color mode or color format. Accordingly, a context register may define multiple states of a GPU. Context states may be utilized to determine how an individual processing unit functions, e.g., a vertex fetcher (VFD), a vertex shader (VS), a shader processor, or a geometry processor, and/or in what mode the processing unit functions. In order to do so, GPUs may use context registers and programming data. In some aspects, a GPU may generate a workload, e.g., a vertex or pixel workload, in the pipeline based on the context register definition of a mode or state. Certain processing units, e.g., a VFD, may use these states to determine certain functions, e.g., how a vertex is assembled. As these modes or states may change, GPUs may need to change the corresponding context. Additionally, the workload that corresponds to the mode or state may follow the changing mode or state.

Figure 2:
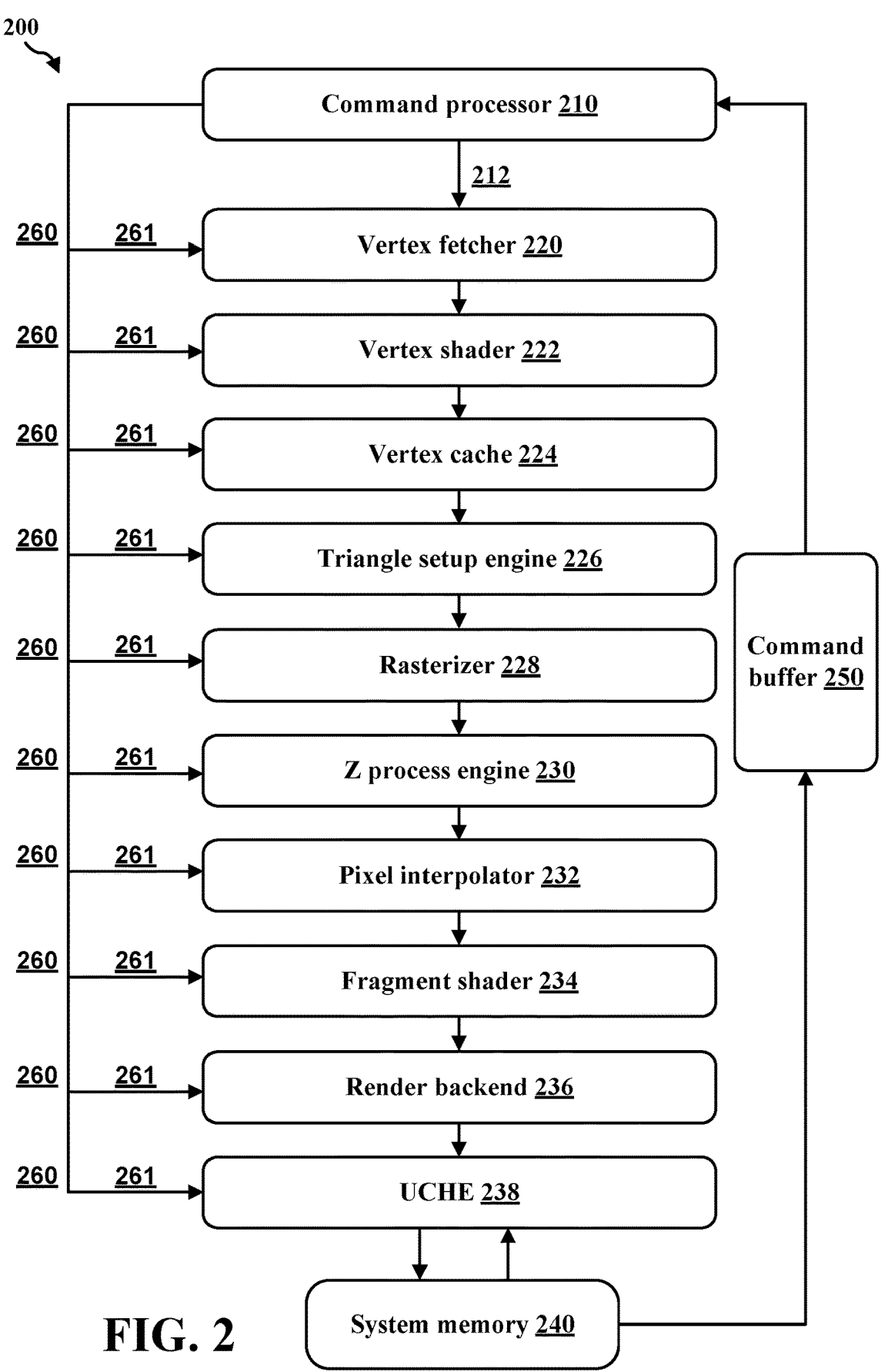
FIG. 2 illustrates an example graphics processing unit (GPU).

FIG. 2 illustrates an example GPU 200 in accordance with one or more techniques of this disclosure. As shown in FIG. 2, GPU 200 includes command processor (CP) 210, draw call packets 212. VFD 220, VS 222, vertex cache (VPC) 224, triangle setup engine (TSE) 226, rasterizer (RAS) 228, Z process engine (ZPE) 230, pixel interpolator (PI) 232, fragment shader (FS) 234, render backend (RB) 236, level 2 (L2) cache (UCHE) 238, and system memory 240. Although FIG. 2 displays that GPU 200 includes processing units 220-238, GPU 200 may include a number of additional processing units. Additionally, processing units 220-238 are merely an example and any combination or order of processing units may be used by GPUS according to the present disclosure. GPU 200 also includes command buffer 250, context register packets 260, and context states 261.

As shown in FIG. 2, a GPU may utilize a CP, e.g., CP 210, or hardware accelerator to parse a command buffer into context register packets, e.g., context register packets 260, and/or draw call data packets, e.g., draw call packets 212. The CP 210 may then send the context register packets 260 or draw call packets 212 through separate paths to the processing units or blocks in the GPU. Further, the command buffer 250 may alternate different states of context registers and draw calls. For example, a command buffer may be structured in the following manner: context register of context N, draw call(s) of context N, context register of context N+1, and draw call(s) of context N+1.

GPUs may render images in a variety of different ways. In some instances, GPUs may render an image using rendering and/or tiled rendering. In tiled rendering GPUS, an image may be divided or separated into different sections or tiles. After the division of the image, each section or tile may be rendered separately. Tiled rendering GPUs may divide computer graphics images into a grid format, such that each portion of the grid, i.e., a tile, is separately rendered. In some aspects, during a binning pass, an image may be divided into different bins or tiles. In some aspects, during the binning pass, a visibility stream may be constructed where visible primitives or draw calls may be identified. In contrast to tiled rendering, direct rendering does not divide the frame into smaller bins or tiles. Rather, in direct rendering, the entire frame is rendered at a single time. Additionally, some types of GPUs may allow for both tiled rendering and direct rendering.

Figure 3:
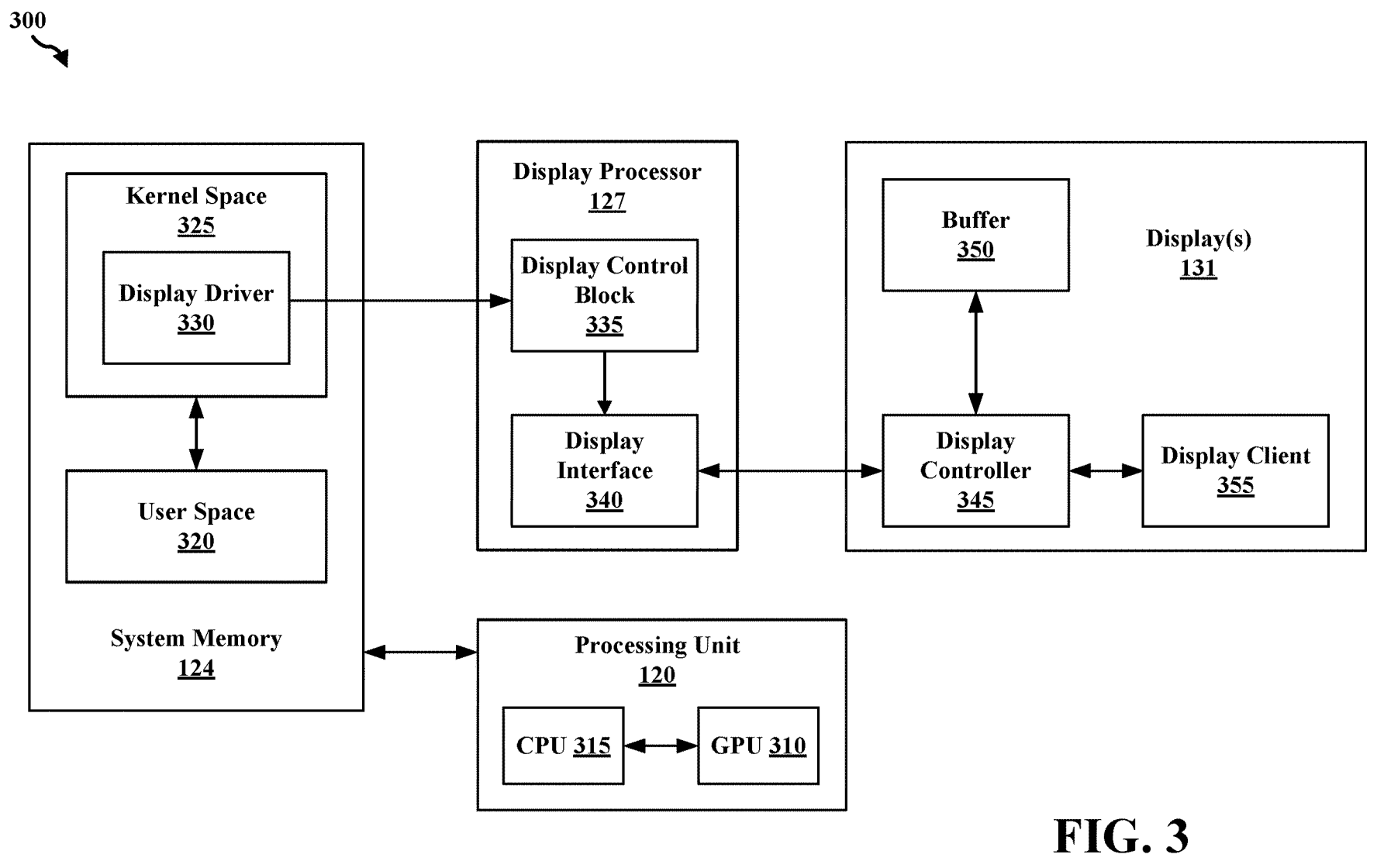

FIG. 3 is a block diagram 300 that illustrates an example display framework including the processing unit 120, the system memory 124, the display processor 127, and the display(s) 131, as may be identified in connection with the device 104.

A GPU may be included in devices that provide content for visual presentation on a display. For example, the processing unit 120 may include a GPU 310 configured to render graphical data for display on a computing device (e.g., the device 104), which may be a computer workstation, a mobile phone, a smartphone or other smart device, an embedded system, a personal computer, a tablet computer, a video game console, and the like. Operations of the GPU 310 may be controlled based on one or more graphics processing commands provided by a CPU 315. The CPU 315 may be configured to execute multiple applications concurrently. In some cases, each of the concurrently executed multiple applications may utilize the GPU 310 simultaneously. Processing techniques may be performed via the processing unit 120 output a frame over physical or wireless communication channels.

The system memory 124, which may be executed by the processing unit 120, may include a user space 320 and a kernel space 325. The user space 320 (sometimes referred to as an "application space") may include software application(s) and/or application framework(s). For example, software application(s) may include operating systems, media applications, graphical applications, workspace applications, etc. Application framework(s) may include frameworks used by one or more software applications, such as libraries, services (e.g., display services, input services, etc.), application program interfaces (APIs), etc. The kernel space 325 may further include a display driver 330. The display driver 330 may be configured to control the display processor 127. For example, the display driver 330 may cause the display processor 127 to compose a frame and transmit the data for the frame to a display.

The display processor 127 includes a display control block 335 and a display interface 340. The display processor 127 may be configured to manipulate functions of the display(s) 131 (e.g., based on an input received from the display driver 330). The display control block 335 may be further configured to output image frames to the display(s) 131 via the display interface 340. In some examples, the display control block 335 may additionally or alternatively perform post-processing of image data provided based on execution of the system memory 124 by the processing unit 120.

The display interface 340 may be configured to cause the display(s) 131 to display image frames. The display interface 340 may output image data to the display(s) 131 according to an interface protocol, such as, for example, the MIPI DSI (Mobile Industry Processor Interface, Display Serial Interface). That is, the display(s) 131, may be configured in accordance with MIPI DSI standards. The MIPI DSI standard supports a video mode and a command mode. In examples where the display(s) 131 is/are operating in video mode, the display processor 127 may continuously refresh the graphical content of the display(s) 131. For example, the entire graphical content may be refreshed per refresh cycle (e.g., line-by-line). In examples where the display(s) 131 is/are operating in command mode, the display processor 127 may write the graphical content of a frame to a buffer 350.

In some such examples, the display processor 127 may not continuously refresh the graphical content of the display(s) 131. Instead, the display processor 127 may use a vertical synchronization (Vsync) pulse to coordinate rendering and consuming of graphical content at the buffer 350. For example, when a Vsync pulse is generated, the display processor 127 may output new graphical content to the buffer 350. Thus, generation of the Vsync pulse may indicate that current graphical content has been rendered at the buffer 350.

Frames are displayed at the display(s) 131 based on a display controller 345, a display client 355, and the buffer 350. The display controller 345 may receive image data from the display interface 340 and store the received image data in the buffer 350. In some examples, the display controller 345 may output the image data stored in the buffer 350 to the display client 355. Thus, the buffer 350 may represent a local memory to the display(s) 131. In some examples, the display controller 345 may output the image data received from the display interface 340 directly to the display client 355.

The display client 355 may be associated with a touch panel that senses interactions between a user and the display(s) 131. As the user interacts with the display(s) 131, one or more sensors in the touch panel may output signals to the display controller 345 that indicate which of the one or more sensors have sensor activity, a duration of the sensor activity, an applied pressure to the one or more sensor, etc. The display controller 345 may use the sensor outputs to determine a manner in which the user has interacted with the display(s) 131. The display(s) 131 may be further associated with/include other devices, such as a camera, a microphone, and/or a speaker, that operate in connection with the display client 355.

Some processing techniques of the device 104 may be performed over three stages (e.g., stage 1: a rendering stage;

stage 2: a composition stage; and stage 3: a display/transfer stage). However, other processing techniques may combine the composition stage and the display/transfer stage into a single stage, such that the processing technique may be executed based on two total stages (e.g., stage 1: the rendering stage; and stage 2: the composition/display/transfer stage). During the rendering stage, the GPU 310 may process a content buffer based on execution of an application that generates content on a pixel-by-pixel basis. During the composition and display stage(s), pixel elements may be assembled to form a frame that is transferred to a physical display panel/subsystem (e.g., the displays 131) that displays the frame.

Instructions executed by a CPU (e.g., software instructions) or a display processor may cause the CPU or the display processor to search for and/or generate a composition strategy for composing a frame based on a dynamic priority and runtime statistics associated with one or more composition strategy groups. A frame to be displayed by a physical display device, such as a display panel, may include a plurality of layers. Also, composition of the frame may be based on combining the plurality of layers into the frame (e.g., based on a frame buffer). After the plurality of layers are combined into the frame, the frame may be provided to the display panel for display thereon. The process of combining each of the plurality of layers into the frame may be referred to as composition, frame composition, a composition procedure, a composition process, or the like.

In some aspects of graphics processing, the rendering of content may be performed in multiple locations and/or on multiple devices, e.g., in order to divide the rendering workload between different devices. For example, the rendering may be split between a server and a client device, which may be referred to as "split rendering." In some instances, split rendering may be a method for bringing content to client devices, where a portion of the graphics processing may be performed outside of the client device, e.g., at a server. In some aspects, the server may be at least one of: a phone, a smart phone, a computer, or a cloud server. Further, the client device may be at least one of: a headset, a head mounted display (HMD), display glasses, or smart glasses.

Data compression is the process of encoding information using fewer bits than the original representation. For instance, the process of reducing the size of data may be referred to as data compression. Data compression may be useful because it reduces the resources utilized to store and transmit data. Different types of data compression may be a lossy compression or a lossless compression. Lossless compression may result in no information being lost during the compression (e.g., reduce the amount of bits by reducing statistical redundancy). Lossless compression is a type of data compression that corresponds to an accurate reconstruction of compressed data (i.e., data that is reconstructed without any data loss). Lossless compression techniques may also include a number of different data compression algorithms that may allow the data to be reconstructed without any data loss. Lossy compression may result in no information being lost during the compression (e.g., reduce the amount of bits by removing unnecessary or less important information). In some aspects, a device that performs data compression may be referred as an encoder, and a device that performs the reverse process (decompression) may be referred as a decoder. Lossy bandwidth compression/decompression may be utilized by many different components of a device, such as a display, a GPU, a video decoder, a camera, and a CPU. Lossy bandwidth compression/decompression may be useful for system-on-chips (SOCs), as SOCs may be configured to perform memory-intensive tasks in which memory bandwidth may be limited. Lossy bandwidth compression/decompression may help to conserve memory bandwidth by compressing surfaces stored in system memory. In some aspects, encoding may be performed at the source of data before it is stored or transmitted, while decoding may be performed after the storage or transmission of the data.

Bandwidth may refer to the maximum rate of data that can be transferred over a given time period and/or across a given path. Bandwidth may be referred to as network bandwidth, data bandwidth, or digital bandwidth. Further, bandwidth may also refer to the multimedia bit rate or average bitrate after multimedia data compression (e.g., source coding), which may be the total amount of data divided by the playback time. Bandwidth compression may refer to the reduction of the bandwidth needed to transmit a given amount of data in a given time. Bandwidth compression may refer to the reduction of the time needed to transmit a given amount of data in a given bandwidth. In some instances, bandwidth compression may imply a reduction in normal bandwidth of data or information without reducing the data or information content. Additionally, bandwidth compression may result in a reduced data amount that may be transferred over a time period.

Some aspects of bandwidth compression may utilize compression techniques (e.g., universal bandwidth compression (UBWC)) to reduce the amount of memory needed to store data. Further, some types of bandwidth compression (e.g., UBWC) may compress a certain type of data (e.g., display data or pixel data) which may help to reduce the total amount of data (e.g., bytes of data). In some aspects, in order to reduce the bandwidth utilized by certain data (e.g., display data), a lossless or lossy format may be utilized to compress the data (e.g., display data). Some types of compression formats (e.g., UBWC) may compress display data by spatially dividing the data into certain types of data (e.g., tiles or subtiles).

There are a number of different types of compression techniques that can be utilized in a number of different processing formats, such as data processing, graphics processing, video processing, camera processing, etc. For example, universal bandwidth compression (e.g., UBWC) or universal bandwidth decompression techniques may be utilized in data processing or graphics processing. Further, different data formats may be associated with compression techniques (e.g., UBWC) that are utilized in data processing or graphics processing. In some aspects, data for a particular data format may be utilized as a format for texture files and/or rendering, e.g., texture files and/or rendering during graphics processing at a GPU. The data for a particular data format may allow certain GPU components (e.g., double data rate (DDR) memory) to reduce the amount of data fetched or retrieved at the GPU. Additionally, the data for a particular data format may correspond to a reduced amount of memory bandwidth utilized.

Figure 4:
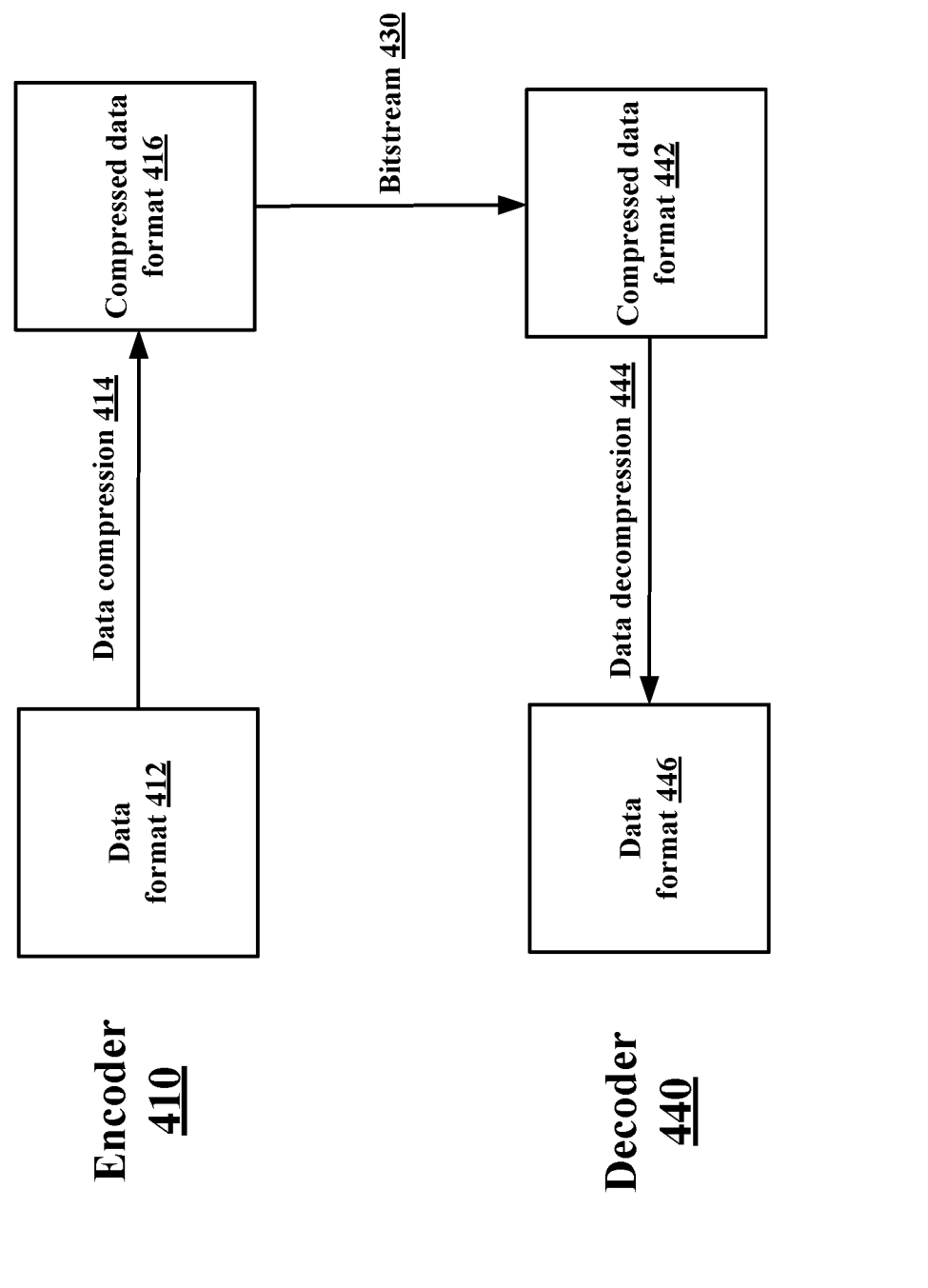
FIG. 4 is a diagram illustrating an example data compression and decompression process.

FIG. 4 is a diagram 400 illustrating an example data compression and decompression process. More specifically, FIG. 4 depicts an example data compression and decompression process for data or graphics processing. As shown in FIG. 4, diagram 400 includes encoder 410, data format 412, data compression 414, compressed data format 416, bitstream 430, compressed data format 442, data decompression 444, data format 446, and decoder 440. FIG. 4 depicts that encoder 410 may perform data compression 414 on data format 412, which may result in compressed data format 416. The encoder 410 may store the compressed data format 416 in bitstream 430 and transmit the bitstream 430 to decoder 440. The decoder 440 may receive bitstream 430 including compressed data format 442. Next, the decoder 440 may perform data decompression 444 on data format 442, which may result in data format 416 (i.e., a decompressed data format). As such, FIG. 4 depicts that encoder 410 may perform a compression process (e.g., data compression 414) and decoder 440 may perform a decompression process (e.g., data decompression 444) for data associated with data processing or graphics processing.

In some aspects, data compression or bandwidth compression (e.g., UBWC) may utilize tiles or subtiles for the compression process. A subtile may be at least a portion of a tile. For instance, the data compression or bandwidth compression (e.g., UBWC) may utilize a tile or subtile prediction process. Also, the tile/subtile bandwidth compression may utilize a raw data comparison for the compression and/or utilize a lossless compression. In some instances, bandwidth reduction may be due to data compression. In some aspects, during a tile/subtile data compression, a tile may be divided or allocated into multiple subtiles (e.g., 4 subtiles) for parallel encoding and decoding. For example, a certain type of tile (e.g., an NV12 luma/Y tile) may be divided into 4 subtiles. A tile or subtile may correspond to a certain number of bytes (e.g., 256 bytes). Also, each subtitle may be coded and decoded independently. Further, the prediction for a certain pixel in a subtile (e.g., the pixel in the top row/left column of a subtile) may come from neighboring pixels (e.g., the immediately adjacent pixels or 1D neighboring pixels). There may also be a parallel processing specification for subtiles, which may mean that the subtiles are coded independently. For instance, the subtile prediction process may transmit each subtile's first pixel (e.g., the pixel in the top row/left column of a subtile) in its current form (i.e., without coding). Also, the subtile's boundary may have certain neighboring pixels as predictors (e.g., immediately adjacent pixels or 1D neighboring pixels as predictors).

Figure 5:
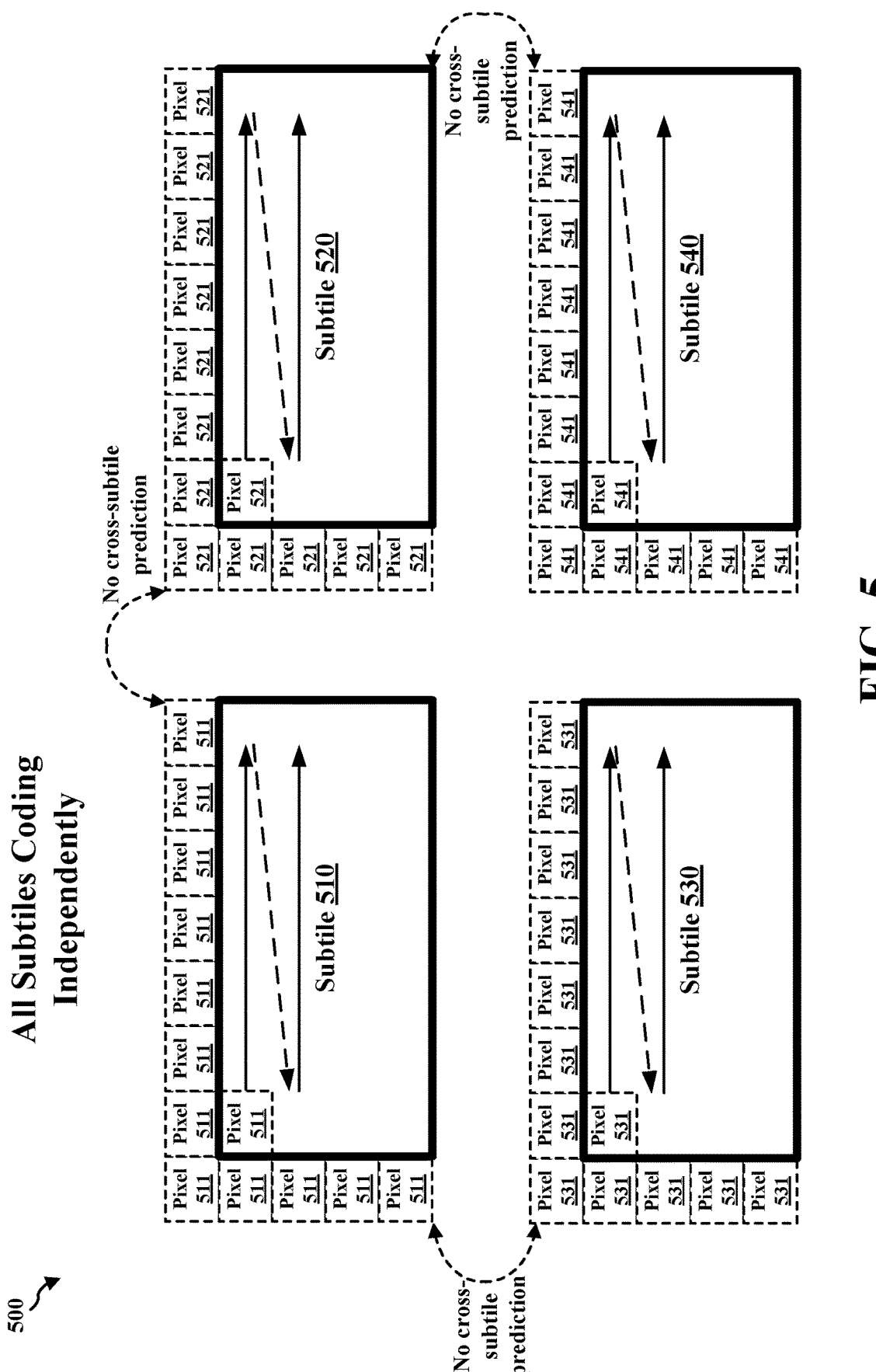
FIG. 5 is a diagram illustrating an example pixel prediction process.

FIG. 5 is a diagram 500 illustrating an example pixel prediction process. More specifically, FIG. 5 depicts n example bandwidth compression and encoding/decoding process including a subtile pixel prediction. As shown in FIG. 5, diagram 500 includes subtile 510 including pixel 511, subtile 520 including pixel 521, subtile 530 including pixel 531, and subtile 540 including pixel 541. FIG. 5 depicts that a tile may be divided into 4 subtiles (e.g., subtile 510, subtile 520, subtile 530, and subtile 540) for a subtile pixel prediction. As shown in FIG. 5, all of the subtiles (e.g., subtile 510, subtile 520, subtile 530, and subtile 540) are coded independently (i.e., without consulting the other subtiles or pixels from other subtiles). Accordingly, there is no cross-subtile prediction between any of the neighboring subtiles (e.g., subtile 510, subtile 520, subtile 530, and subtile 540). As depicted in FIG. 5, the subtile pixel prediction may utilize a certain type of prediction (e.g., a parallelogram prediction) for immediately adjacent pixels. For example, for predicting a certain pixel P, the pixel may be predicted as $P=A+B-C$, where A is a left adjacent pixel, B is a top adjacent pixel, and C is a top-left diagonally adjacent pixel.

As depicted in FIG. 5, the prediction for a certain pixel in a subtile (e.g., pixel 511 in subtile 510) may come from neighboring pixels (e.g., the pixels that are immediately adjacent to pixel 511 on the left or top of the pixel, i.e., the 1D neighboring pixels). There may also be parallel processing for the subtiles (e.g., subtile 510, subtile 520, subtile 530, and subtile 540), such that the subtiles are coded independently. For instance, the subtile prediction process may transmit each subtile's first pixel (e.g., pixel 511, pixel 521, pixel 531, and pixel 541) in its current form (i.e., without coding). The subtile's boundary may have certain neighboring pixels as predictors (e.g., the pixels that are immediately adjacent to pixel 511/521/531/541 on the left or top of the pixel, i.e., the 1D neighboring pixels). As illustrated in FIG. 5, the subtile prediction may copy a subtile's first pixel (e.g., pixel 511, pixel 521, pixel 531, pixel 541) as a predictor for a top row and left column. FIG. 5 shows that the pixel may be predicted as P=A+B-C, where A is a left adjacent pixel, B is a top adjacent pixel, and C is a top-left diagonally adjacent pixel. Also, the subtile prediction may place each subtile's first pixel (e.g., pixel 511, pixel 521, pixel 531, pixel 541) in a bitstream (i.e., there is no prediction and coding). As shown in FIG. 5, the pixels in the subtiles (e.g., subtile 510, subtile 520, subtile 530, and subtile 540) are predicted in the order of the arrows, such as starting at leftmost pixel in the first row (e.g., pixel 511/521/531/541) and moving to the right down the first row, then starting at the leftmost portion in the second row and moving to the right down the second row, etc. As indicated in FIG. 5, subtile-based hardware parallel encoding and decoding may lead to a higher throughput. In current bandwidth compressions (e.g., UBWC), for the purpose of efficient hardware parallel encoding and decoding, a tile may be divided into multiple subtiles (e.g., for NV12 format data, a tile may be split into 4 subtiles). Also, self-contained pixel prediction may lead to lower latency, which may be used for certain types of subtile processing (e.g., UBWC subtile processing). This may result in no prediction dependency between subtiles, which may result in no subtiles including decoding latency. That is, for the hardware encoding or decoding, no neighboring subtile pixels may be needed for current subtile processing (e.g., UBWC subtile processing). However, for the pixels on the top row and left column of all subtiles, the corresponding predictors may be the first pixel of that subtile, which are combined with the immediate left or top neighboring pixels (i.e., the 1D predictor pixels) of the current pixel to be predicted.

Additionally, while the aforementioned parallel encoding and decoding may achieve a low latency and high throughput, it may be lacking in coding efficiency. For instance, in order to achieve subtiles independent and parallel encoding/decoding processing (i.e., to obtain low latency and high throughput), there may be a tradeoff of coding efficiency. For example, in FIG. 5 the subtiles are coded/decoded independent of neighboring subtiles, so the corresponding pixels (e.g., pixel 511/521/531/541) in certain subtiles (e.g., subtile 510, subtile 520, subtile 530, and subtile 540) with a higher correlation may not be used during the prediction process, which results in less coding efficiency. That is, a lack of utilizing certain neighboring pixels with a higher correlation (e.g., 2D neighboring pixels for a subtile's boundary (top row and left column)) during the prediction process may result in less coding efficiency for the bandwidth compression process. For instance, for boundary pixels (e.g., top-left pixels), the corresponding higher-correlation pixels may not be used during the prediction process. Accordingly, some types of bandwidth compressions (e.g., UBWC) with parallel dependent decoding may result in a reduced coding efficiency, as certain neighboring pixels of a pixel may not be used to predict the pixel. Further, parallel dependent decoding may result in needing to wait for all subtiles to finish decoding before the prediction process can finish, which may result in an increased latency. In some aspects, a tile may be divided into multiple subtiles, but these multiple subtiles may not be decoded in parallel, as there may be cross-subtile predictions which can introduce cross-subtile dependency. Thus, there may be no parallel decoding, which may result in a higher latency. Based on the above, it may be beneficial to increase the coding efficiency for bandwidth compressions that utilize encoding for subtile and pixel prediction. For instance, it may be beneficial to utilize certain neighboring pixels of a pixel during the prediction process in order to more efficiently predict the pixel. Additionally, it may be beneficial to reduce the amount of latency during decoding of a subtile and pixel prediction process.

Aspects of the present disclosure may increase the coding efficiency for bandwidth compressions that utilize encoding for subtile and pixel prediction. For instance, aspects presented herein may utilize certain neighboring pixels (e.g., high correlation pixels) of a pixel during the prediction process in order to more efficiently predict the pixel. Additionally, aspects presented herein may reduce the amount of latency during decoding of a subtile and pixel prediction process. For example, aspects presented herein may utilize coding/decoding for subtiles that is dependent on neighboring subtiles and pixels in order to predict the subtiles/pixels in a more efficient manner. By doing so, aspects presented herein may not need to wait for all subtiles/pixels to finish encoding/decoding before the prediction process can finish. That is, aspects presented herein may utilize some of the subtile/pixel predictions from neighboring subtiles/pixels in order to reduce the amount of time spent during a subtile/pixel prediction process. A subtile/pixel prediction process may refer to a prediction for a subtile/pixel, which utilizes the neighboring pixels/data as predictors for current pixels/data. In some aspects, the subtile/pixel prediction process may be utilized for boundary pixels of a current subtile, which can utilize the neighboring pixels from an adjacent subtile as predictors for the boundary pixels of the current subtile, and may result in a higher coding efficiency without resulting in higher latency.

Aspects presented herein may adjust the scanning order for pixels within different subtiles for the subtile/pixel prediction process. For instance, for current subtile/pixel predictions, the scanning order for all subtiles may start with the top-left pixel and scan right, moving down by row (as shown in FIG. 5). That is, current subtile/pixel predictions may scan pixels in every subtile in the same order (e.g., an order from left to right and top to bottom). As mentioned above, this may result in waiting for each subtile/pixel to finish scanning in order to finish the prediction process for cross-subtile prediction. In contrast, aspects presented herein may adjust the scanning order for subtile/pixel predictions. Indeed, aspects presented herein may reverse scanning order for subtile/pixel predictions in order to increase the efficiency and reduce the latency for the overall subtile/pixel prediction. For example, for one subtile, aspects presented herein may start scanning with the bottom-right pixel and scan left, moving up row-by-row. For another subtile, aspects presented herein may start scanning with the bottom-left pixel and scan right, moving up row-by-row. For yet another subtile, aspects presented herein may start scanning with the top-right pixel and scan left, moving down row-by-row. For yet another subtile, aspects presented herein may start scanning with the top-left pixel and scan right, moving down row-by-row.

Accordingly, aspects presented herein may scan adjacent subtiles differently, which may help to increase the efficiency and reduce the latency for the overall subtile/pixel prediction. That is, by using different scanning orders for different subtiles, aspects presented herein may scan pixels in a different order, and then use those scanned pixels to predict the pixels in other subtiles. So adjacent subtiles that already scanned a certain pixel may be used to predict the corresponding pixel in another subtile, which may reduce the latency of the overall subtile/pixel prediction process. In some aspects, this latency reduction may be experienced at the decoder during a predictor generation for reconstruction processing. This latency reduction may be compared to cross-subtile prediction and maintain a current normal raster scanning order within subtiles. Also, this may increase the efficiency of the subtile/pixel prediction, as a more varied prediction for higher correlation pixels may be utilized to predict corresponding pixels. Additionally, aspects presented herein may relate to cross subtile prediction. As mentioned herein, in current bandwidth compressions (e.g., UBWC), for hardware parallel encoding and decoding, a tile may be split into multiple subtiles (e.g., 4 subtiles). Also, in current bandwidth compressions, predictions for subtiles' top row/left column may come from certain neighbors (e.g., 1D neighbors). In particular, the corresponding predictors may be the first pixel of that particular subtile. Because of parallel processing specifications for subtiles, current coding may be performed independently and there may be no cross-subtile prediction. Aspects presented herein may utilize cross-subtiles' prediction by a reverse raster-scanning pixel order in subtiles, prediction of the first pixels, and saving bits for the first pixel of a number of subtiles (e.g., 3 subtiles). Additionally, aspects presented herein may utilize coding of the subtiles that may be dependent on each other.

In some instances, aspects presented herein may utilize cross supplier dependency coding. That is, aspects presented herein may utilize one pixel in one subtile as a predictor for another pixel in an adjacent subtile. This may result in dependent coding in adjacent subtiles and pixels. For instance, dependent coding may mean that aspects presented herein may use certain subtile pixels as a predictor for corresponding subtile pixels (e.g., high correlation pixels). In some aspects, once the prediction of one pixel is available, the corresponding pixels can be reconstructed based on the predicted pixel. Also, by scanning adjacent subtiles in a different order, pixels from the different subtiles can be used to predict corresponding pixels in adjacent subtiles. That is, aspects presented herein may adjust the order of a raster scanning process for the pixels of the different subtitles. For instance, aspects presented herein may use the encoded pixels of adjacent subtitles in order to reduce the amount of latency during the decoding process. In some instances, a normal raster scanning order may be an order of an image access that begins with top-left pixel/data within an image or box, and then moves from a left-to-right order per row, and then proceeds to move down each row from top to bottom until the raster scanning process is complete for the image or box. Also, a reverse raster scanning order may be an order of an image access that begins with a different pixel/data location within an image or box (i.e., different than the top-left pixel/data) and then moves in a different order per row, and then proceeds to address different rows until the raster scanning process is complete for the image or box.

In some aspects, during the decoding reconstruction process, aspects presented herein may use the encoded pixel values of adjacent subtiles in order to reduce the amount of decoding delay. For example, aspects presented herein may switch the order of raster scanning the pixels for adjacent subtiles during encoding, and by doing so, aspects presented herein may increase coding efficiency during encoding.

Indeed, aspects presented herein may utilize neighbor subtitles as a predictor during the decoding reconstruction process, as the prediction process was already performed in a reverse manner for adjacent subtiles during the encoding process. So during the decoding process, aspects presented herein may not need to wait for the neighboring subtiles to fully process during reconstruction. As such, aspects presented herein may not need to wait for all of the neighboring subtitles/pixels to be predicted in an adjacent subtile (e.g., during a normal raster scanning process) in order to finish the reconstruction processing (e.g., during the decoding process). By doing so, aspects presented herein may reduce the latency, as well as increase the efficiency, of the overall subtile/pixel prediction process.

Aspects presented herein may utilize cross-subtile prediction (e.g., for luminance/luma (Y) subtiles) for a pixel prediction process. In some instances, aspects presented herein may reverse raster-scanning the pixel order in adjacent subtiles. By doing so, aspects presented herein may increase the spatial correlation for a certain pixel in a subtile (e.g., the pixel in a subtile's top row/left column). Aspects presented herein may also utilize a prediction for certain pixels in a subtile (e.g., the first pixel or the pixel in a subtile's top row/left column). For instance, aspects presented herein may use a certain pixel for a certain subtile (e.g., a first pixel for a Y0 subtile) as a predictive value for other adjacent subtiles (e.g., 3 other subtiles with a high spatial correlation). By doing so, aspects presented herein may reduce the amount of bits for the prediction of the other subtiles' corresponding pixels (e.g., the first pixel for 3 corresponding subtiles). Also, aspects presented herein may solely need to transmit the predicted pixel for the certain subtile (e.g., a first pixel for a Y0 subtile). Assuming there are a certain number of adjacent subtiles, aspects presented herein may reduce the amount of bits for those corresponding pixels in the adjacent subtiles (e.g., saving bits for 3 pixels corresponding to 3 adjacent subtiles).

FIG. 6 is a diagram 600 illustrating an example pixel prediction process. More specifically, FIG. 6 depicts an example bandwidth compression encoding/decoding process including a tile's pixel prediction and reconstruction. As shown in FIG. 6, diagram 600 includes subtile 610 including pixel 611, subtile 620 including pixel 621, subtile 630 including pixel 631, and subtile 640 including pixel 641. FIG. 6 depicts that a tile may be divided into 4 subtiles (e.g., subtile 610, subtile 620, subtile 630, and subtile 640) for a subtile pixel prediction. In some examples, the subtiles in FIG. 6 may be luminance/luma (Y) subtiles. As shown in FIG. 6, all of the subtiles (e.g., subtile 610, subtile 620, subtile 630, and subtile 640) may be coded dependently (i.e., by referencing the other subtiles or pixels from other subtiles). Thus, there may be cross-subtile prediction between the neighboring subtiles (e.g., subtile 610, subtile 620, subtile 630, and subtile 640).

As depicted in FIG. 6, aspects presented herein may adjust the scanning order for subtile/pixel predictions. FIG. 6 shows that aspects presented herein may reverse a scanning order for subtile/pixel predictions (e.g., pixels 611/621/631/641 in subtiles 610/620/630/640) in order to increase the coding efficiency and reduce the latency for the overall subtile/pixel prediction process at an encoder and a reconstruction process at a decoder. For example, for subtile 610, the scanning may begin with pixel 611 (i.e., the bottom-right pixel) and proceed to scan left, and then move up row-by-row. For subtile 620, the scanning may begin with pixel 621 (i.e., the bottom-left pixel) and proceed to scan right, and then move up row-by-row. For subtile 630, the scanning may begin with pixel 631 (i.e., the top-right pixel) and proceed to scan left, and then move down row-by-row. For subtile 640, the scanning may begin with pixel 641 (i.e., the top-left pixel) and proceed to scan right, and then move down row-by-row. As such, aspects presented herein may scan subtiles 610/620/630/640 differently, which may help to increase the coding efficiency of encoding processing and reduce the latency of decoding processing for the overall subtile/pixel prediction process. That is, by using different scanning orders for subtiles 610/620/630/640, aspects presented herein may scan pixels (e.g., pixels 611/621/631/641) in a different order, and then use those different pixels to predict the pixels in other subtiles (e.g., subtiles 610/620/630/640). Indeed, subtiles that already scanned a certain pixel (e.g., pixel 611 in subtile 610) may be used to predict the corresponding pixel in another subtile (e.g., a corresponding pixel in subtiles 620/630/640), which may reduce the latency of decoding processing and increase the coding efficiency of encoding processing of the overall subtile/pixel prediction process.

As depicted in FIG. 6, the subtile pixel prediction may utilize a cross-subtile prediction including a reverse raster-scanning pixel order in adjacent subtiles. This may increase the spatial correlation for a certain pixel in a subtile. Aspects presented herein may also utilize a prediction for certain pixels in a subtile (e.g., the first pixel or the pixel in a subtile's top row/left column). For instance, aspects presented herein may use a certain pixel for a certain subtile (e.g., a first pixel for a subtile 610) as a predictive value for other adjacent subtiles (e.g., subtile 620, subtile 630, and subtile 640) which include a high spatial correlation. By doing so, the amount of residual bits may be reduced for the prediction of the other subtiles' corresponding pixels (e.g., the first pixel for subtile 620, subtile 630, and subtile 640). That is, the prediction for a certain pixel in a subtile (e.g., pixel 611 in subtile 610) may be a corresponding pixel in a neighboring subtile (e.g., a corresponding pixel in subtile 620, subtile 630, or subtile 640). Also, the predicted pixel (e.g., pixel 611) may just be transmitted for subtile 610, while the corresponding pixels may not need to be transmitted. This may save the amount of bits for the 3 pixels corresponding to adjacent subtiles 620/630/640. Also, in some aspects, other pixel locations from a subtile may be used as a predictive value for other adjacent subtiles.

As shown in FIG. 6, aspects presented herein may utilize reverse raster scanning, such that a decoder's reconstruction processing may not need to wait for a neighboring subtile's reconstruction processing (e.g., may have a 1-pixel latency). Also, aspects presented herein may increase the coding efficiency of encoding processing for the neighboring subtiles that are being used as a predictive value or a predictor. As shown in FIG. 6, the solid arrows show that aspects presented herein may use the neighboring subtiles as a predictor for the encoding/decoding of the adjacent subtiles. The dashed arrows depict the starting pixel for each subtile (e.g., pixel 611 in subtile 610, pixel 621 in subtile 620, pixel 631 in subtile 630, and pixel 641 in subtile 640). As depicted in FIG. 6, after reverse raster scanning, aspects presented herein may use these pixels (611, 621, 631, 641) to encode pixels of the adjacent subtiles in order reduce the amount of decoding latency/delay (e.g., compared to normal cross-subtile prediction). For example, pixel 611 may be used to predict pixel 621, pixel 631, or pixel 641. Further, the cross-subtile prediction may increase the coding efficiency (i.e., the compression ratio) of encoding processing. As shown in FIG. 6, the arrows indicate the prediction pixels from neighboring subtiles. At the encoder, these predictors may be used for prediction/residual generations. At the decoder, these predictors may be used for reconstruction.

Figure 7:
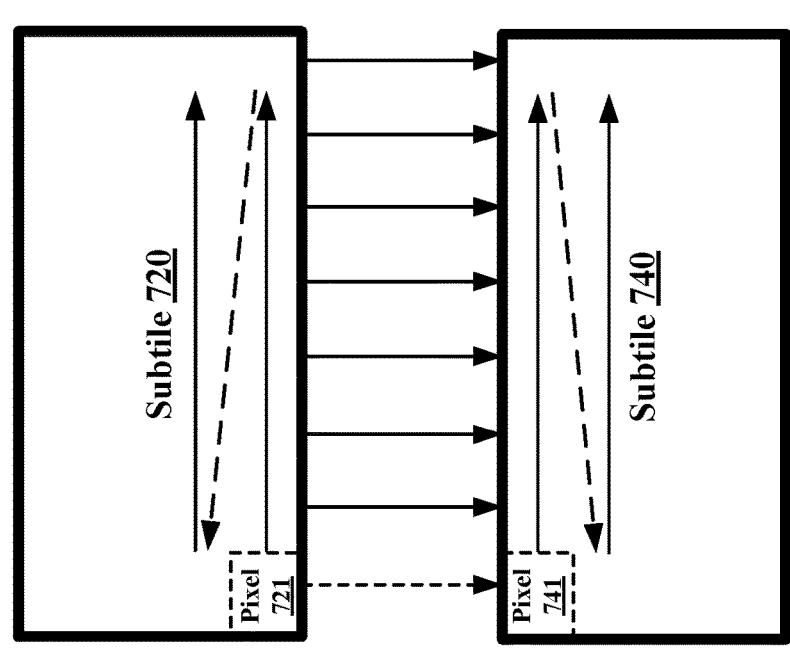
FIG. 7 is a diagram illustrating an example pixel prediction process.
Figure 7:
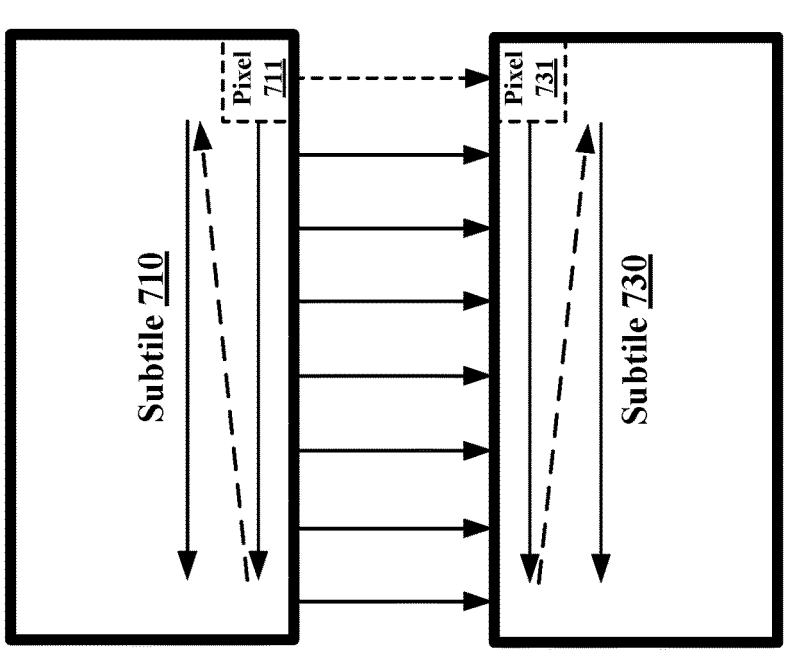
Figure 7:

FIG. 7 is a diagram 700 illustrating an example pixel prediction process. More specifically, FIG. 7 depicts an example bandwidth compression encoding/decoding process including a tile's pixel prediction and reconstruction. As shown in FIG. 7, diagram 700 includes subtile 710 including pixel 711, subtile 720 including pixel 721, subtile 730 including pixel 731, and subtile 740 including pixel 741. FIG. 7 depicts that a tile may be divided into 4 subtiles (e.g., subtile 710, subtile 720, subtile 730, and subtile 740) for a subtile pixel prediction. In some example, the subtiles in FIG. 7 may be chrominance/chroma (UV) subtiles. As shown in FIG. 7, the top and corresponding bottom subtiles (e.g., subtile 710 and subtile 730, as well as subtile 720 and subtile 740) may be coded dependently (i.e., by referencing the other subtiles or pixels from the other subtile). Therefore, there may be cross-subtile prediction between the neighboring subtiles (e.g., for subtile 710 and subtile 730, and for subtile 720 and subtile 740).

As depicted in FIG. 7, aspects presented herein may adjust the scanning order for subtile/pixel predictions. FIG. 7 shows that aspects presented herein may reverse scanning order for subtile/pixel predictions (e.g., pixels 711/721/731/741 in subtiles 710/720/730/740) in order to increase the coding efficiency of encoding processing and reduce the latency of decoding processing for the overall subtile/pixel prediction process at an encoder and a reconstruction process at a decoder. For example, for subtile 710, the scanning may begin with pixel 711 (i.e., the bottom-right pixel) and proceed to scan left, and then move up row-by-row. For subtile 730 (coded dependently with subtile 710), the scanning may begin with pixel 731 (i.e., the top-right pixel) and proceed to scan left, and then move down row-by-row. For subtile 720, the scanning may begin with pixel 721 (i.e., the bottom-left pixel) and proceed to scan right, and then move up row-by-row. For subtile 740 (coded dependently with subtile 720), the scanning may begin with pixel 741 (i.e., the top-left pixel) and proceed to scan right, and then move down row-by-row. Accordingly, aspects presented herein may scan subtiles 710/720/730/740 differently, which may help to increase the coding efficiency of encoding processing and reduce the latency of decoding processing for the overall subtile/pixel prediction process. That is, by using different scanning orders for subtiles 710/720/730/740, aspects presented herein may scan pixels (e.g., pixels 711/721/731/741) in a different order, and then use those different pixels to predict the pixels in other subtiles (e.g., subtiles 710/720/730/740). Subtiles that already scanned a certain pixel (e.g., pixel 711 in subtile 710) may be used to predict the corresponding pixel in another subtile (e.g., a corresponding pixel in subtiles 720/730/740), which may reduce the latency of decoding processing for the overall subtile/pixel prediction process. As shown in FIG. 7, the solid arrows show that aspects presented herein may use the neighboring subtiles as a predictor for the encoding/decoding of the adjacent subtiles. The dashed arrows depict the starting pixel for each subtile (e.g., pixel 711 in subtile 710 and pixel 721 in subtile 720).

As shown in FIG. 7, the subtile pixel prediction may utilize a cross-subtile prediction (e.g., for UV subtiles) including a reverse raster-scanning pixel order in adjacent subtiles. This may increase the spatial correlation for a certain pixel in a subtile. Aspects presented herein may also utilize a prediction for certain pixels in a subtile (e.g., the first pixel or the pixel in a subtile's top row/left column). For instance, aspects presented herein may use a certain pixel for a certain subtile (e.g., a pixel 711 in subtile 710) as a predictive value for a corresponding pixel in an adjacent dependent subtile (e.g., pixel 731 in subtile 730) which includes a high spatial correlation. In some instances, subtile 710 and subtile 730 may be first chroma (U) subtiles, and subtile 720 and subtile 740 may be second chroma (V) subtiles. For instance, pixel 711 in subtile 710 (e.g., subtile U0) may be used as the first pixel predictor for bottom subtile 730 (e.g., subtile U2). Also, pixel 721 in subtile 720 may be used as a predictive value for a corresponding pixel in an adjacent dependent subtile (e.g., pixel 741 in subtile 740). For instance, pixel 721 in subtile 720 (e.g., subtile V0) may be used as the first pixel predictor for bottom subtile 740 (e.g., subtile U2). By doing so, aspects presented herein may reduce the amount of residual bits for the first pixel of bottom two subtiles (e.g., subtile 730 and subtile 740). That is, the predicted pixel for the top subtiles (e.g., pixel 711 in subtile 710 and pixel 721 in subtile 720) may just be transmitted, while the corresponding pixels for the bottom two subtiles (e.g., subtile 730 and subtile 740) may not need to be transmitted. This may save the amount of bits for the 2 pixels corresponding to subtile 730 and subtile 740. Also, in some instances, the total bits may be equal to a certain number of bits/pixel (e.g., (3+2)*bits/pixel). The aforementioned process may be utilized with red (R), green (G), blue (B) (RGB) subtiles, as well as luminance/luma (Y) chrominance/chroma (UV) (YUV) subtiles. In some aspects, other pixel locations from a subtile may be used as a predictive value for other adjacent subtiles.

Figure 8:
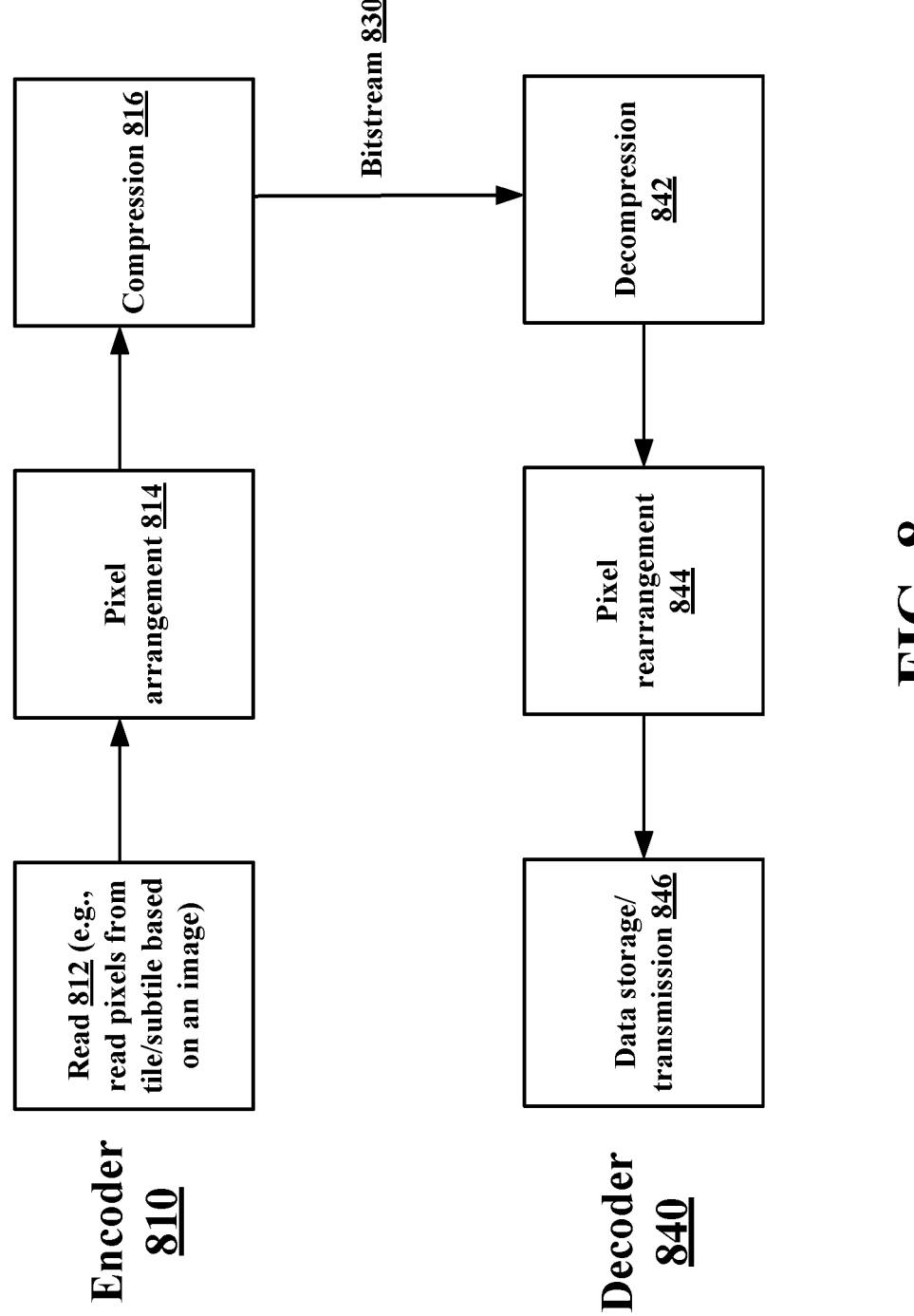
FIG. 8 is a diagram illustrating an example data compression and decompression process.

FIG. 8 is a diagram 800 illustrating an example data compression and decompression process. More specifically, FIG. 8 depicts an example data compression and decompression process for data or graphics processing according to aspects of the present disclosure. As shown in FIG. 8, diagram 800 includes encoder 810, read process 812, pixel arrangement 814, compression process 816, bitstream 830, decompression process 842, pixel rearrangement 844, data storage/transmission 846, and decoder 840. FIG. 8 depicts that encoder 810 may perform read process 812 (e.g., read pixels from tile/subtile based on an image). The encoder 810 may then perform a pixel arrangement 814 on the read pixels. Next, the encoder 810 may perform compression process 816 on the arranged pixels. After compressing the pixels, encoder 810 may store the compressed pixels in bitstream 830 and transmit the bitstream 830 to decoder 840. The decoder 840 may receive bitstream 830 including compressed pixels. Next, the decoder 840 may perform decompression process 842 on the compressed pixels. Also, the decoder 840 may perform a pixel rearrangement 844 on the decompressed pixels. After this, the decoder 840 may store or transmit the pixels at data storage/transmission 846. As such, FIG. 8 depicts that encoder 810 may perform a compression process (e.g., compression process 816) and decoder 840 may perform a decompression process (e.g., decompression process 842) for data associated with data processing or graphics processing.

As shown in FIG. 8, aspects presented herein (e.g., a CPU/GPU/DPU) may obtain an indication of a set of data subunits corresponding to at least one data unit (e.g., at read process 812), where the set of data subunits is associated with a bandwidth compression process. A data subunit may be a unit that is smaller than a data unit. As depicted in FIG. 8, aspects presented herein may also arrange data for the set of data subunits into a first data order for the set of data subunits (e.g., at pixel arrangement 814). Also, as shown in FIG. 8, aspects presented herein may perform, based on the first data order, at least one of an encoding process on the data for each data subunit of the set of data subunits (e.g., compression process 816) or a decoding process on the data for each data subunit of the set of data subunits (e.g., decompression process 842). Further, as depicted in FIG. 8, aspects presented herein may rearrange the data for the set of data subunits into the first data order for a first data subunit in the set of data subunits and into a second data order for at least one second data subunit in the set of data subunits (e.g., at pixel rearrangement 844), where the first data order is different from the second data order. As shown in FIG. 8, aspects presented herein may also output an indication of the rearranged data for the set of data subunits including the first data order for the first data subunit and the second data order for the at least one second data subunit (e.g., at data storage/transmission 846). Additionally, as depicted in FIG. 8, aspects presented herein may transmit an indication of the at least one pixel in the first data subunit (e.g., at data storage/transmission 846); and refrain from transmitting an indication of the at least one pixel in each of the at least one second data subunit (e.g., at data storage/transmission 846). As shown in FIG. 8, aspects presented herein may also read, based on at least one of the encoding process or the decoding process, the data for each data subunit of the set of data subunits (e.g., at read process 812). Moreover, as depicted in FIG. 8, aspects presented herein may allocate the at least one data unit into the set of data subunits (e.g., at read process 812), where the allocation of the at least one data unit into the set of data subunits is based on the obtainment of the indication of the set of data subunits corresponding to the at least one data unit.

Aspects presented herein may include a number of benefits or advantages. For instance, aspects presented herein may increase the coding efficiency of encoding processing for compression (e.g., especially for lossless compression). Further, aspects presented herein may maintain a high-throughput and a low-latency for decoding processing. Aspects presented herein may also utilize an input/output (I/O) re-ordering for decoding processing. Additionally, aspects of the present disclosure may increase the coding efficiency of encoding processing for bandwidth compressions that utilize encoding for subtile and pixel prediction. For example, aspects presented herein may utilize certain neighboring pixels (e.g., high correlation pixels) of a pixel during the prediction process in order to more efficiently predict the pixel. Also, aspects presented herein may reduce the amount of latency during decoding of a subtile and pixel prediction process. For instance, aspects presented herein may utilize decoding for subtiles that is dependent on neighboring subtiles and pixels in order to predict the subtiles/pixels in a more efficient manner. That is, aspects presented herein may not need to wait for all subtiles/pixels to finish decoding before the prediction process can finish. Aspects presented herein may utilize some of the subtile/pixel predictions from neighboring subtiles/pixels in order to reduce the amount of time spent during the subtile/pixel prediction process.

Figure 9:
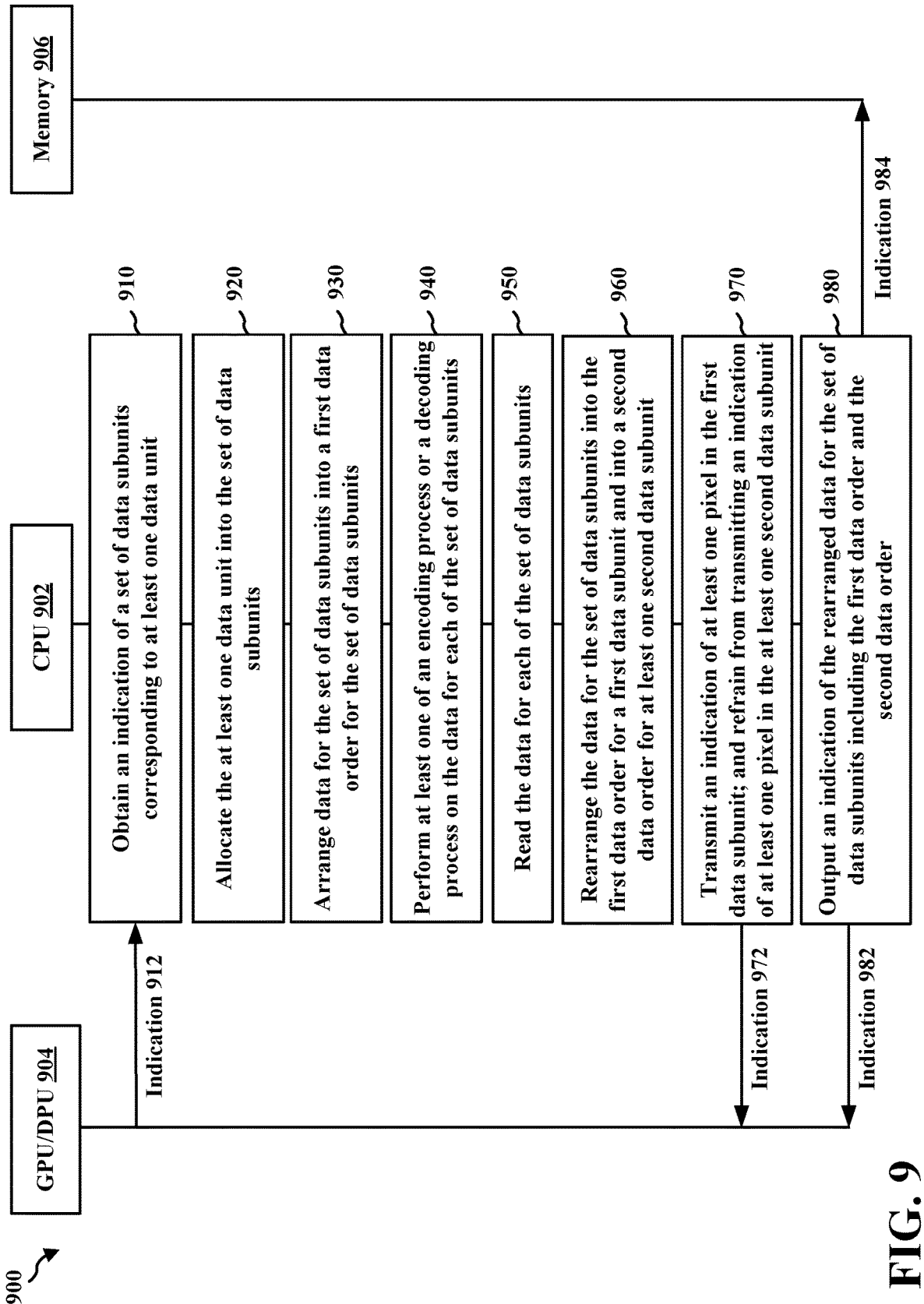
FIG. 9 is a communication flow diagram illustrating example communications between a CPU, a GPU/DPU, and a memory.

FIG. 9 is a communication flow diagram 900 of display processing in accordance with one or more techniques of this disclosure. As shown in FIG. 9, diagram 900 includes example communications between CPU 902 (e.g., a DPU driver, other central processor, or display processor), GPU/DPU 904 (e.g., a GPU, a graphics processor, a DPU, a display processor, a hardware controller, or an application), and memory 906 (e.g., a memory or a register at a CPU or GPU), in accordance with one or more techniques of this disclosure.

At 910, CPU 902 may obtain an indication of a set of data subunits corresponding to at least one data unit (e.g., CPU 902 may obtain indication 912 from GPU/DPU 904), where the set of data subunits is associated with a bandwidth compression process. In some aspects, the at least one data unit may be at least one tile in an image frame, and the set of data subunits may be a set of first subtiles. Also, the set of data subunits may correspond to a coding unit for the bandwidth compression process.

At 920, CPU 902 may allocate the at least one data unit into the set of data subunits, where the allocation of the at least one data unit into the set of data subunits is based on the obtainment of the indication of the set of data subunits corresponding to the at least one data unit.

At 930, CPU 902 may arrange data for the set of data subunits into a first data order for the set of data subunits. In some aspects, arranging the data for the set of data subunits may include (e.g., comprise): performing a raster scanning process on the set of data subunits based on the first data order. Also, each of the set of data subunits may include a plurality of pixels, where arranging the data for the set of data subunits may include: arranging the plurality of pixels in each of the set of data subunits into the first data order.

At 940, CPU 902 may perform, based on the first data order, at least one of an encoding process on the data for each data subunit of the set of data subunits or a decoding process on the data for each data subunit of the set of data subunits. In some aspects, performing the encoding process may include: performing the encoding process in parallel for each subunit of the set of data subunits. Also, performing the decoding process may include: performing the decoding process in parallel for each subunit of the set of data subunits. In some aspects, performing the encoding process may include: compressing the data for each data subunit of the set of data subunits. Further, performing the decoding process may include: decompressing the data for each data subunit of the set of data subunits. The compression of the data for each data subunit may be a lossless compression, and the decompression of the data for each data subunit may be a lossless decompression. Moreover, compressing the data for each data subunit may include: compressing the data for each data subunit into a bitstream for the set of data subunits; and storing, in the bitstream, the compressed data for each data subunit of the set of data subunits. Also, decompressing the data for each data subunit may include: decompressing the data for each data subunit from the bitstream.

At 950, CPU 902 may read, based on at least one of the encoding process or the decoding process, the data for each data subunit of the set of data subunits. In some aspects, reading the data for each data subunit may include: retrieving, from a first memory or a first cache based on at least one of the encoding process or the decoding process, the data for each data subunit of the set of data subunits. Also, reading the data for each data subunit may include: receiving, based on at least one of the encoding process or the decoding process, the data for each data subunit of the set of data subunits.

At 960, CPU 902 may rearrange the data for the set of data subunits into the first data order for a first data subunit in the set of data subunits and into a second data order for at least one second data subunit in the set of data subunits, where the first data order is different from the second data order. In some aspects, each of the set of data subunits may include a plurality of pixels. Also, rearranging the data for the set of data subunits may include: rearranging the plurality of pixels in the first data subunit into the first data order; and rearranging the plurality of pixels in each of the at least one second data subunit into the second data order. Further, rearranging the plurality of pixels in each of the at least one second data subunit into the second data order may include: estimating at least one pixel of the plurality of pixels in each of the at least one second data subunit based on at least one pixel of the plurality of pixels in the first data subunit. In some aspects, the at least one second data subunit may include at least two second data subunits, and rearranging the data for the set of data subunits may include: rearranging the data for the set of data subunits into the first data order for the first data subunit and into the second data order for one of the at least two second data subunits and into a third data order for another of the at least two second data subunits, where the first data order may be different from the second data order and the third data order. In some aspects, rearranging the data for the set of data subunits may include: performing a reverse raster scanning process on the set of data subunits based on the first data order and the second data order, where the reverse raster scanning process associated with the rearrangement of the data may be different from the raster scanning process associated with the arrangement of the data.

At 970, CPU 902 may transmit an indication of at least one pixel in the first data subunit (e.g., CPU 902 may transmit indication 972 to GPU/DPU 904); and refrain from transmitting an indication of at least one pixel in each of the at least one second data subunit.

At 980, CPU 902 may output an indication of the rearranged data for the set of data subunits including the first data order for the first data subunit and the second data order for the at least one second data subunit. In some aspects, outputting the indication of the rearranged data for the set of data subunits may include includes: transmitting the indication of the rearranged data for the set of data subunits. That is, the CPU may transmit the indication of the rearranged data for the set of data subunits (e.g., CPU 902 may transmit indication 982 to GPU/DPU 904). Also, outputting the indication of the rearranged data for the set of data subunits may include: storing, in a first memory or a first cache, the indication of the rearranged data for the set of data subunits. That is, the CPU may store, in a first memory or a first cache, the indication of the rearranged data for the set of data subunits (e.g., CPU 902 may store indication 984 in memory 906).

FIG. 10 is a flowchart 1000 of an example method of data processing in accordance with one or more techniques of this disclosure. The method may be performed by a CPU (or other central processor), a DPU driver, a DPU (or other display processor), a GPU (or other graphics processor), a DDIC, an apparatus for display processing, a wireless communication device, and/or any apparatus that may perform data processing as used in connection with the examples of FIGS. 1-9.

At 1002, the CPU may obtain an indication of a set of data subunits corresponding to at least one data unit, where the set of data subunits is associated with a bandwidth compression process, as described in connection with the examples in FIGS. 1-9. For example, as described in 910 of FIG. 9, CPU 902 may obtain an indication of a set of data subunits corresponding to at least one data unit, where the set of data subunits is associated with a bandwidth compression process. Further, step 1002 may be performed by processing unit 120 in FIG. 1. In some aspects, the at least one data unit may be at least one tile in an image frame, and the set of data subunits may be a set of first subtiles. Also, the set of data subunits may correspond to a coding unit for the bandwidth compression process.

At 1006, the CPU may arrange data for the set of data subunits into a first data order for the set of data subunits, as described in connection with the examples in FIGS. 1-9. For example, as described in 930 of FIG. 9, CPU 902 may arrange data for the set of data subunits into a first data order for the set of data subunits. Further, step 1006 may be performed by processing unit 120 in FIG. 1. In some aspects, arranging the data for the set of data subunits may include: performing a raster scanning process on the set of data subunits based on the first data order. Also, each of the set of data subunits may include a plurality of pixels, where arranging the data for the set of data subunits may include: arranging the plurality of pixels in each of the set of data subunits into the first data order.

At 1008, the CPU may perform, based on the first data order, at least one of an encoding process on the data for each data subunit of the set of data subunits or a decoding process on the data for each data subunit of the set of data subunits, as described in connection with the examples in FIGS. 1-9. For example, as described in 940 of FIG. 9, CPU 902 may perform, based on the first data order, at least one of an encoding process on the data for each data subunit of the set of data subunits or a decoding process on the data for each data subunit of the set of data subunits. Further, step 1008 may be performed by processing unit 120 in FIG. 1. In some aspects, performing the encoding process may include: performing the encoding process in parallel for each subunit of the set of data subunits. Also, performing the decoding process may include: performing the decoding process in parallel for each subunit of the set of data subunits. In some aspects, performing the encoding process may include: compressing the data for each data subunit of the set of data subunits. Further, performing the decoding process may include: decompressing the data for each data subunit of the set of data subunits. The compression of the data for each data subunit may be a lossless compression, and the decompression of the data for each data subunit may be a lossless decompression. Moreover, compressing the data for each data subunit may include: compressing the data for each data subunit into a bitstream for the set of data subunits; and storing, in the bitstream, the compressed data for each data subunit of the set of data subunits. Also, decompressing the data for each data subunit may include: decompressing the data for each data subunit from the bitstream.

At 1012, the CPU may rearrange the data for the set of data subunits into the first data order for a first data subunit in the set of data subunits and into a second data order for at least one second data subunit in the set of data subunits, where the first data order is different from the second data order, as described in connection with the examples in FIGS. 1-9. For example, as described in 960 of FIG. 9, CPU 902 may rearrange the data for the set of data subunits into the first data order for a first data subunit in the set of data subunits and into a second data order for at least one second data subunit in the set of data subunits, where the first data order is different from the second data order. Further, step 1012 may be performed by processing unit 120 in FIG. 1. In some aspects, each of the set of data subunits may include a plurality of pixels. Also, rearranging the data for the set of data subunits may include: rearranging the plurality of pixels in the first data subunit into the first data order; and rearranging the plurality of pixels in each of the at least one second data subunit into the second data order. Further, rearranging the plurality of pixels in each of the at least one second data subunit into the second data order may include:

estimating at least one pixel of the plurality of pixels in each of the at least one second data subunit based on at least one pixel of the plurality of pixels in the first data subunit. In some aspects, the at least one second data subunit may include at least two second data subunits, and rearranging the data for the set of data subunits may include: rearranging the data for the set of data subunits into the first data order for the first data subunit and into the second data order for one of the at least two second data subunits and into a third data order for another of the at least two second data subunits, where the first data order may be different from the second data order and the third data order. In some aspects, rearranging the data for the set of data subunits may include: performing a reverse raster scanning process on the set of data subunits based on the first data order and the second data order, where the reverse raster scanning process associated with the rearrangement of the data may be different from the raster scanning process associated with the arrangement of the data.

FIG. 11 is a flowchart 1100 of an example method of data processing in accordance with one or more techniques of this disclosure. The method may be performed by a CPU (or other central processor), a DPU driver, a DPU (or other display processor), a GPU (or other graphics processor), a DDIC, an apparatus for display processing, a wireless communication device, and/or any apparatus that may perform data processing as used in connection with the examples of FIGS. 1-9.

At 1102, the CPU may obtain an indication of a set of data subunits corresponding to at least one data unit, where the set of data subunits is associated with a bandwidth compression process, as described in connection with the examples in FIGS. 1-9. For example, as described in 910 of FIG. 9, CPU 902 may obtain an indication of a set of data subunits corresponding to at least one data unit, where the set of data subunits is associated with a bandwidth compression process. Further, step 1102 may be performed by processing unit 120 in FIG. 1. In some aspects, the at least one data unit may be at least one tile in an image frame, and the set of data subunits may be a set of first subtiles. Also, the set of data subunits may correspond to a coding unit for the bandwidth compression process.

At 1104, the CPU may allocate the at least one data unit into the set of data subunits, where the allocation of the at least one data unit into the set of data subunits is based on the obtainment of the indication of the set of data subunits corresponding to the at least one data unit, as described in connection with the examples in FIGS. 1-9. For example, as described in 920 of FIG. 9, CPU 902 may allocate the at least one data unit into the set of data subunits, where the allocation of the at least one data unit into the set of data subunits is based on the obtainment of the indication of the set of data subunits corresponding to the at least one data unit. Further, step 1104 may be performed by processing unit 120 in FIG. 1.

At 1106, the CPU may arrange data for the set of data subunits into a first data order for the set of data subunits, as described in connection with the examples in FIGS. 1-9. For example, as described in 930 of FIG. 9, CPU 902 may arrange data for the set of data subunits into a first data order for the set of data subunits. Further, step 1106 may be performed by processing unit 120 in FIG. 1. In some aspects, arranging the data for the set of data subunits may include: performing a raster scanning process on the set of data subunits based on the first data order. Also, each of the set of data subunits may include a plurality of pixels, where arranging the data for the set of data subunits may include:

arranging the plurality of pixels in each of the set of data subunits into the first data order.

At 1108, the CPU may perform, based on the first data order, at least one of an encoding process on the data for each data subunit of the set of data subunits or a decoding process on the data for each data subunit of the set of data subunits, as described in connection with the examples in FIGS. 1-9. For example, as described in 940 of FIG. 9, CPU 902 may perform, based on the first data order, at least one of an encoding process on the data for each data subunit of the set of data subunits or a decoding process on the data for each data subunit of the set of data subunits. Further, step 1108 may be performed by processing unit 120 in FIG. 1. In some aspects, performing the encoding process may include: performing the encoding process in parallel for each subunit of the set of data subunits. Also, performing the decoding process may include: performing the decoding process in parallel for each subunit of the set of data subunits. In some aspects, performing the encoding process may include: compressing the data for each data subunit of the set of data subunits. Further, performing the decoding process may include: decompressing the data for each data subunit of the set of data subunits. The compression of the data for each data subunit may be a lossless compression, and the decompression of the data for each data subunit may be a lossless decompression. Moreover, compressing the data for each data subunit may include: compressing the data for each data subunit into a bitstream for the set of data subunits; and storing, in the bitstream, the compressed data for each data subunit of the set of data subunits. Also, decompressing the data for each data subunit may include: decompressing the data for each data subunit from the bitstream.

At 1110, the CPU may read, based on at least one of the encoding process or the decoding process, the data for each data subunit of the set of data subunits, as described in connection with the examples in FIGS. 1-9. For example, as described in 950 of FIG. 9, CPU 902 may read, based on at least one of the encoding process or the decoding process, the data for each data subunit of the set of data subunits. Further, step 1110 may be performed by processing unit 120 in FIG. 1. In some aspects, reading the data for each data subunit may include: retrieving, from a first memory or a first cache based on at least one of the encoding process or the decoding process, the data for each data subunit of the set of data subunits. Also, reading the data for each data subunit may include: receiving, based on at least one of the encoding process or the decoding process, the data for each data subunit of the set of data subunits.

At 1112, the CPU may rearrange the data for the set of data subunits into the first data order for a first data subunit in the set of data subunits and into a second data order for at least one second data subunit in the set of data subunits, where the first data order is different from the second data order, as described in connection with the examples in FIGS. 1-9. For example, as described in 960 of FIG. 9, CPU 902 may rearrange the data for the set of data subunits into the first data order for a first data subunit in the set of data subunits and into a second data order for at least one second data subunit in the set of data subunits, where the first data order is different from the second data order. Further, step 1112 may be performed by processing unit 120 in FIG. 1. In some aspects, each of the set of data subunits may include a plurality of pixels. Also, rearranging the data for the set of data subunits may include: rearranging the plurality of pixels in the first data subunit into the first data order; and rearranging the plurality of pixels in each of the at least one second data subunit into the second data order. Further, rearranging the plurality of pixels in each of the at least one second data subunit into the second data order may include: estimating at least one pixel of the plurality of pixels in each of the at least one second data subunit based on at least one pixel of the plurality of pixels in the first data subunit. In some aspects, the at least one second data subunit may include at least two second data subunits, and rearranging the data for the set of data subunits may include: rearranging the data for the set of data subunits into the first data order for the first data subunit and into the second data order for one of the at least two second data subunits and into a third data order for another of the at least two second data subunits, where the first data order may be different from the second data order and the third data order. In some aspects, rearranging the data for the set of data subunits may include: performing a reverse raster scanning process on the set of data subunits based on the first data order and the second data order, where the reverse raster scanning process associated with the rearrangement of the data may be different from the raster scanning process associated with the arrangement of the data.

At 1114, the CPU may transmit an indication of at least one pixel in the first data subunit; and refrain from transmitting an indication of at least one pixel in each of the at least one second data subunit, as described in connection with the examples in FIGS. 1-9. For example, as described in 970 of FIG. 9, CPU 902 may transmit an indication of at least one pixel in the first data subunit; and refrain from transmitting an indication of at least one pixel in each of the at least one second data subunit. Further, step 1114 may be performed by processing unit 120 in FIG. 1.

At 1116, the CPU may output an indication of the rearranged data for the set of data subunits including the first data order for the first data subunit and the second data order for the at least one second data subunit, as described in connection with the examples in FIGS. 1-9. For example, as described in 980 of FIG. 9, CPU 902 may output an indication of the rearranged data for the set of data subunits including the first data order for the first data subunit and the second data order for the at least one second data subunit. Further, step 1116 may be performed by processing unit 120 in FIG. 1. In some aspects, outputting the indication of the rearranged data for the set of data subunits may include: transmitting the indication of the rearranged data for the set of data subunits. That is, the CPU may transmit the indication of the rearranged data for the set of data subunits. Also, outputting the indication of the rearranged data for the set of data subunits may include: storing, in a first memory or a first cache, the indication of the rearranged data for the set of data subunits. That is, the CPU may store, in a first memory or a first cache, the indication of the rearranged data for the set of data subunits.

In configurations, a method or an apparatus for display processing is provided. The apparatus may be a CPU (or other central processor), a DPU (or other display processor), a GPU (or other graphics processor), a DPU driver, a DDIC, an apparatus for display processing, and/or some other processor that may perform display processing. In aspects, the apparatus may be the processing unit 120 within the device 104, or may be some other hardware within the device 104 or another device. The apparatus, e.g., processing unit 120, may include means for obtaining an indication of a set of data subunits corresponding to at least one data unit, where the set of data subunits is associated with a bandwidth compression process. The apparatus, e.g., processing unit 120, may also include means for arranging data for the set of data subunits into a first data order for the set of data subunits. The apparatus, e.g., processing unit 120, may also include means for performing, based on the first data order, at least one of an encoding process on the data for each data subunit of the set of data subunits or a decoding process on the data for each data subunit of the set of data subunits. The apparatus, e.g., processing unit 120, may also include means for rearranging the data for the set of data subunits into the first data order for a first data subunit in the set of data subunits and into a second data order for at least one second data subunit in the set of data subunits, where the first data order is different from the second data order. The apparatus, e.g., processing unit 120, may also include means for outputting an indication of the rearranged data for the set of data subunits including the first data order for the first data subunit and the second data order for the at least one second data subunit. The apparatus, e.g., processing unit 120, may also include means for transmitting an indication of the at least one pixel in the first data subunit; and means for refraining from transmitting an indication of the at least one pixel in each of the at least one second data subunit. The apparatus, e.g., processing unit 120, may also include means for reading, based on at least one of the encoding process or the decoding process, the data for each data subunit of the set of data subunits. The apparatus, e.g., processing unit 120, may also include means for allocating the at least one data unit into the set of data subunits, where the allocation of the at least one data unit into the set of data subunits is based on the obtainment of the indication of the set of data subunits corresponding to the at least one data unit.

The subject matter described herein may be implemented to realize one or more benefits or advantages. For instance, the described data processing techniques may be used by a CPU, a central processor, a DPU driver, a DPU, a display processor, a GPU, or some other processor that may perform data processing to implement the cross subtile prediction techniques described herein. This may also be accomplished at a low cost compared to other data processing techniques. Moreover, the data processing techniques herein may improve or speed up data processing or execution. Further, the data processing techniques herein may improve resource or data utilization and/or resource efficiency. Additionally, aspects of the present disclosure may utilize cross subtile prediction techniques in order to improve memory bandwidth efficiency and/or increase processing speed at a CPU, a DPU or a GPU.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects.

Unless specifically stated otherwise, the term "some" refers to one or more and the term "or" may be interpreted as "and/or" where context does not dictate otherwise. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B. A and C. B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

In one or more examples, the functions described herein may be implemented in hardware, software, firmware, or any combination thereof. For example, although the term "processing unit" has been used throughout this disclosure, such processing units may be implemented in hardware, software, firmware, or any combination thereof. If any function, processing unit, technique described herein, or other module is implemented in software, the function, processing unit, technique described herein, or other module may be stored on or transmitted over as one or more instructions or code on a computer-readable medium.

In accordance with this disclosure, the term "or" may be interpreted as "and/or" where context does not dictate otherwise. Additionally, while phrases such as "one or more" or "at least one" or the like may have been used for some features disclosed herein but not others, the features for which such language was not used may be interpreted to have such a meaning implied where context does not dictate otherwise.

In one or more examples, the functions described herein may be implemented in hardware, software, firmware, or any combination thereof. For example, although the term "processing unit" has been used throughout this disclosure, such processing units may be implemented in hardware, software, firmware, or any combination thereof. If any function, processing unit, technique described herein, or other module is implemented in software, the function, processing unit, technique described herein, or other module may be stored on or transmitted over as one or more instructions or code on a computer-readable medium. Computer-readable media may include computer data storage media or communication media including any medium that facilitates transfer of a computer program from one place to another. In this manner, computer-readable media generally may correspond to (1) tangible computer-readable storage media, which is non-transitory or (2) a communication medium such as a signal or carrier wave. Data storage media may be any available media that may be accessed by one or more computers or one or more processors to retrieve instructions, code and/or data structures for implementation of the techniques described in this disclosure. By way of example, and not limitation, such computer-readable media may comprise RAM, ROM, EEPROM, CD-ROM or other optical disk storage, magnetic disk storage or other magnetic storage devices. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media. A computer program product may include a computer-readable medium.

The code may be executed by one or more processors, such as one or more digital signal processors (DSPs), general purpose microprocessors, application specific integrated circuits (ASICs), arithmetic logic units (ALUs), field programmable logic arrays (FPGAs), or other equivalent integrated or discrete logic circuitry. Accordingly, the term "processor," as used herein may refer to any of the foregoing structure or any other structure suitable for implementation of the techniques described herein. Also, the techniques could be fully implemented in one or more circuits or logic elements.

The techniques of this disclosure may be implemented in a wide variety of devices or apparatuses, including a wireless handset, an integrated circuit (IC) or a set of ICs, e.g., a chip set. Various components, modules or units are described in this disclosure to emphasize functional aspects of devices configured to perform the disclosed techniques, but do not necessarily need realization by different hardware units. Rather, as described above, various units may be combined in any hardware unit or provided by a collection of inter-operative hardware units, including one or more processors as described above, in conjunction with suitable software and/or firmware. Accordingly, the term "processor," as used herein may refer to any of the foregoing structure or any other structure suitable for implementation of the techniques described herein. Also, the techniques may be fully implemented in one or more circuits or logic elements.

The following aspects are illustrative only and may be combined with other aspects or teachings described herein, without limitation.

Aspect 1 is an apparatus for data processing, including at least one memory; and at least one processor coupled to the at least one memory and, based at least in part on information stored in the at least one memory, the at least one processor, individually or in any combination, is configured to: obtain an indication of a set of data subunits corresponding to at least one data unit, wherein the set of data subunits is associated with a bandwidth compression process; arrange data for the set of data subunits into a first data order for the set of data subunits; perform, based on the first data order, at least one of an encoding process on the data for each data subunit of the set of data subunits or a decoding process on the data for each data subunit of the set of data subunits; and rearrange the data for the set of data subunits into the first data order for a first data subunit in the set of data subunits and into a second data order for at least one second data subunit in the set of data subunits, wherein the first data order is different from the second data order.

Aspect 2 is the apparatus of aspect 1, wherein the at least one processor, individually or in any combination, is further configured to: output an indication of the rearranged data for the set of data subunits including the first data order for the first data subunit and the second data order for the at least one second data subunit.

Aspect 3 is the apparatus of aspect 2, wherein to output the indication of the rearranged data for the set of data subunits, the at least one processor, individually or in any combination, is configured to: transmit the indication of the rearranged data for the set of data subunits; or store, in a first memory or a first cache, the indication of the rearranged data for the set of data subunits.

Aspect 4 is the apparatus of any of aspects 1 to 3, wherein each of the set of data subunits includes a plurality of pixels, and wherein to rearrange the data for the set of data subunits, the at least one processor, individually or in any combination, is configured to: rearrange the plurality of pixels in the first data subunit into the first data order; and rearrange the plurality of pixels in each of the at least one second data subunit into the second data order.

Aspect 5 is the apparatus of aspect 4, wherein to rearrange the plurality of pixels in each of the at least one second data subunit into the second data order, the at least one processor, individually or in any combination, is configured to: estimate at least one pixel of the plurality of pixels in each of the at least one second data subunit based on at least one pixel of the plurality of pixels in the first data subunit.

Aspect 6 is the apparatus of aspect 5, wherein the at least one processor, individually or in any combination, is further configured to: transmit an indication of the at least one pixel in the first data subunit; and refrain from transmitting an indication of the at least one pixel in each of the at least one second data subunit.

Aspect 7 is the apparatus of any of aspects 1 to 6, wherein the at least one second data subunit includes at least two second data subunits, and wherein to rearrange the data for the set of data subunits, the at least one processor, individually or in any combination, is configured to: rearrange the data for the set of data subunits into the first data order for the first data subunit and into the second data order for one of the at least two second data subunits and into a third data order for another of the at least two second data subunits, wherein the first data order is different from the second data order and the third data order.

Aspect 8 is the apparatus of any of aspects 1 to 7, wherein to arrange the data for the set of data subunits, the at least one processor, individually or in any combination, is configured to: perform a raster scanning process on the set of data subunits based on the first data order.

Aspect 9 is the apparatus of aspect 8, wherein to rearrange the data for the set of data subunits, the at least one processor, individually or in any combination, is configured to: perform a reverse raster scanning process on the set of data subunits based on the first data order and the second data order, wherein the reverse raster scanning process associated with the rearrangement of the data is different from the raster scanning process associated with the arrangement of the data.

Aspect 10 is the apparatus of any of aspects 1 to 9, wherein each of the set of data subunits includes a plurality of pixels, wherein to arrange the data for the set of data subunits, the at least one processor, individually or in any combination, is configured to: arrange the plurality of pixels in each of the set of data subunits into the first data order.

Aspect 11 is the apparatus of any of aspects 1 to 10, wherein the at least one processor, individually or in any combination, is further configured to: read, based on at least one of the encoding process or the decoding process, the data for each data subunit of the set of data subunits.

Aspect 12 is the apparatus of aspect 11, wherein to read the data for each data subunit, the at least one processor, individually or in any combination, is configured to: retrieve, from a first memory or a first cache based on at least one of the encoding process or the decoding process, the data for each data subunit of the set of data subunits.

Aspect 13 is the apparatus of aspect 11, wherein to read the data for each data subunit, the at least one processor, individually or in any combination, is configured to: receive, based on at least one of the encoding process or the decoding process, the data for each data subunit of the set of data subunits.

Aspect 14 is the apparatus of any of aspects 1 to 13, wherein the at least one processor, individually or in any combination, is further configured to: allocate the at least one data unit into the set of data subunits, wherein the allocation of the at least one data unit into the set of data subunits is based on the obtainment of the indication of the set of data subunits corresponding to the at least one data unit.

Aspect 15 is the apparatus of any of aspects 1 to 14, wherein to perform the encoding process, the at least one processor, individually or in any combination, is configured to: perform the encoding process in parallel for each subunit of the set of data subunits; wherein to perform the decoding process, the at least one processor, individually or in any combination, is configured to: perform the decoding process in parallel for each subunit of the set of data subunits.

Aspect 16 is the apparatus of any of aspects 1 to 15, wherein to perform the encoding process, the at least one processor, individually or in any combination, is configured to: compress the data for each data subunit of the set of data subunits; wherein to perform the decoding process, the at least one processor, individually or in any combination, is configured to: decompress the data for each data subunit of the set of data subunits.

Aspect 17 is the apparatus of aspect 16, wherein the compression of the data for each data subunit is a lossless compression, and wherein the decompression of the data for each data subunit is a lossless decompression.

Aspect 18 is the apparatus of aspect 16 or 17, wherein to compress the data for each data subunit, the at least one processor, individually or in any combination, is configured to: compress the data for each data subunit into a bitstream for the set of data subunits; and store, in the bitstream, the compressed data for each data subunit of the set of data subunits; wherein to decompress the data for each data subunit, the at least one processor, individually or in any combination, is configured to: decompress the data for each data subunit from the bitstream.

Aspect 19 is the apparatus of any of aspects 1 to 18, wherein the at least one data unit is at least one tile in an image frame, and wherein the set of data subunits is a set of first subtiles.

Aspect 20 is the apparatus of any of aspects 1 to 19, further comprising at least one of an antenna or a transceiver coupled to the at least one processor, wherein to obtain the indication of the set of data subunits, the at least one processor, individually or in any combination, is configured to: obtain, via at least one of the antenna or the transceiver, the indication of the set of data subunits, wherein the set of data subunits corresponds to a coding unit for the bandwidth compression process.

Aspect 21 is a method of data processing for implementing any of aspects 1 to 20.

Aspect 22 is an apparatus for data processing including means for implementing any of aspects 1 to 20.

Aspect 23 is a computer-readable medium (e.g., a non-transitory computer-readable medium) storing computer executable code, the code when executed by at least one processor causes the at least one processor to implement any of aspects 1 to 20.

What is claimed is:

1. An apparatus for data processing, comprising:
at least one memory; and
at least one processor coupled to the at least one memory and, based at least in part on information stored in the at least one memory, the at least one processor, individually or in any combination, is configured to:
obtain an indication of a set of data subunits corresponding to at least one data unit, wherein the set of data subunits is associated with a bandwidth compression process;
arrange data for the set of data subunits into a first data order for the set of data subunits;
perform, based on the first data order, at least one of an encoding process on the data for each data subunit of the set of data subunits or a decoding process on the data for each data subunit of the set of data subunits; and
rearrange the data for the set of data subunits into the first data order for a first data subunit in the set of data subunits and into a second data order for at least one second data subunit in the set of data subunits, wherein the first data order is different from the second data order.

2. The apparatus of claim 1, wherein the at least one processor, individually or in any combination, is further configured to:
output an indication of the rearranged data for the set of data subunits including the first data order for the first data subunit and the second data order for the at least one second data subunit.

3. The apparatus of claim 2, wherein to output the indication of the rearranged data for the set of data subunits, the at least one processor, individually or in any combination, is configured to:
transmit the indication of the rearranged data for the set of data subunits; or
store, in a first memory or a first cache, the indication of the rearranged data for the set of data subunits.

4. The apparatus of claim 1, wherein each of the set of data subunits includes a plurality of pixels, and wherein to rearrange the data for the set of data subunits, the at least one processor, individually or in any combination, is configured to:
rearrange the plurality of pixels in the first data subunit into the first data order; and
rearrange the plurality of pixels in each of the at least one second data subunit into the second data order.

5. The apparatus of claim 4, wherein to rearrange the plurality of pixels in each of the at least one second data subunit into the second data order, the at least one processor, individually or in any combination, is configured to:
estimate at least one pixel of the plurality of pixels in each of the at least one second data subunit based on at least one pixel of the plurality of pixels in the first data subunit.

6. The apparatus of claim 5, wherein the at least one processor, individually or in any combination, is further configured to:
transmit an indication of the at least one pixel in the first data subunit; and refrain from transmitting an indication of the at least one pixel in each of the at least one second data subunit.

7. The apparatus of claim 1, wherein the at least one second data subunit includes at least two second data subunits, and wherein to rearrange the data for the set of data subunits, the at least one processor, individually or in any combination, is configured to:

rearrange the data for the set of data subunits into the first data order for the first data subunit and into the second data order for one of the at least two second data subunits and into a third data order for another of the at least two second data subunits, wherein the first data order is different from the second data order and the third data order.

8. The apparatus of claim 1, wherein to arrange the data for the set of data subunits, the at least one processor, individually or in any combination, is configured to:

perform a raster scanning process on the set of data subunits based on the first data order.

9. The apparatus of claim 8, wherein to rearrange the data for the set of data subunits, the at least one processor, individually or in any combination, is configured to:

perform a reverse raster scanning process on the set of data subunits based on the first data order and the second data order, wherein the reverse raster scanning process associated with the rearrangement of the data is different from the raster scanning process associated with the arrangement of the data.

10. The apparatus of claim 1, wherein each of the set of data subunits includes a plurality of pixels, wherein to arrange the data for the set of data subunits, the at least one processor, individually or in any combination, is configured to: arrange the plurality of pixels in each of the set of data subunits into the first data order.

11. The apparatus of claim 1, wherein the at least one processor, individually or in any combination, is further configured to:

read, based on at least one of the encoding process or the decoding process, the data for each data subunit of the set of data subunits.

12. The apparatus of claim 11, wherein to read the data for each data subunit, the at least one processor, individually or in any combination, is configured to:

retrieve, from a first memory or a first cache based on at least one of the encoding process or the decoding process, the data for each data subunit of the set of data subunits.

13. The apparatus of claim 11, wherein to read the data for each data subunit, the at least one processor, individually or in any combination, is configured to:

receive, based on at least one of the encoding process or the decoding process, the data for each data subunit of the set of data subunits.

14. The apparatus of claim 1, wherein the at least one processor, individually or in any combination, is further configured to:

allocate the at least one data unit into the set of data subunits, wherein the allocation of the at least one data unit into the set of data subunits is based on the obtainment of the indication of the set of data subunits corresponding to the at least one data unit.

15. The apparatus of claim 1, wherein to perform the encoding process, the at least one processor, individually or in any combination, is configured to: perform the encoding process in parallel for each subunit of the set of data subunits;

wherein to perform the decoding process, the at least one processor, individually or in any combination, is configured to: perform the decoding process in parallel for each subunit of the set of data subunits.

16. The apparatus of claim 1, wherein to perform the encoding process, the at least one processor, individually or in any combination, is configured to: compress the data for each data subunit of the set of data subunits;

wherein to perform the decoding process, the at least one processor, individually or in any combination, is configured to: decompress the data for each data subunit of the set of data subunits.

17. The apparatus of claim 16, wherein the compression of the data for each data subunit is a lossless compression, and wherein the decompression of the data for each data subunit is a lossless decompression.

18. The apparatus of claim 16, wherein to compress the data for each data subunit, the at least one processor, individually or in any combination, is configured to:

compress the data for each data subunit into a bitstream for the set of data subunits; and store, in the bitstream, the compressed data for each data subunit of the set of data subunits;

wherein to decompress the data for each data subunit, the at least one processor, individually or in any combination, is configured to: decompress the data for each data subunit from the bitstream.

19. The apparatus of claim 1, wherein the at least one data unit is at least one tile in an image frame, and wherein the set of data subunits is a set of first subtiles.

20. The apparatus of claim 1, further comprising at least one of an antenna or a transceiver coupled to the at least one processor, wherein to obtain the indication of the set of data subunits, the at least one processor, individually or in any combination, is configured to: obtain, via at least one of the antenna or the transceiver, the indication of the set of data subunits, wherein the set of data subunits corresponds to a coding unit for the bandwidth compression process.

21. A method of data processing, comprising:

obtaining an indication of a set of data subunits corresponding to at least one data unit, wherein the set of data subunits is associated with a bandwidth compression process;

arranging data for the set of data subunits into a first data order for the set of data subunits;

performing, based on the first data order, at least one of an encoding process on the data for each data subunit of the set of data subunits or a decoding process on the data for each data subunit of the set of data subunits; and rearranging the data for the set of data subunits into the first data order for a first data subunit in the set of data subunits and into a second data order for at least one second data subunit in the set of data subunits, wherein the first data order is different from the second data order.

22. The method of claim 21, further comprising:

outputting an indication of the rearranged data for the set of data subunits including the first data order for the first data subunit and the second data order for the at least one second data subunit.

23. The method of claim 22, wherein outputting the indication of the rearranged data for the set of data subunits comprises:

transmitting the indication of the rearranged data for the set of data subunits; or storing, in a first memory or a first cache, the indication of the rearranged data for the set of data subunits.

24. The method of claim 21, wherein each of the set of data subunits includes a plurality of pixels, and wherein rearranging the data for the set of data subunits comprises:

rearranging the plurality of pixels in the first data subunit into the first data order; and rearranging the plurality of pixels in each of the at least one second data subunit into the second data order.

25. The method of claim 24, wherein rearranging the plurality of pixels in each of the at least one second data subunit into the second data order comprises: estimating at least one pixel of the plurality of pixels in each of the at least one second data subunit based on at least one pixel of the plurality of pixels in the first data subunit; and the method further comprising:

transmitting an indication of the at least one pixel in the first data subunit; and refraining from transmitting an indication of the at least one pixel in each of the at least one second data subunit.

26. The method of claim 21, wherein the at least one second data subunit includes at least two second data subunits, and wherein rearranging the data for the set of data subunits comprises:

rearranging the data for the set of data subunits into the first data order for the first data subunit and into the second data order for one of the at least two second data subunits and into a third data order for another of the at least two second data subunits, wherein the first data order is different from the second data order and the third data order.

27. The method of claim 21, wherein arranging the data for the set of data subunits comprises: performing a raster scanning process on the set of data subunits based on the first data order;

wherein rearranging the data for the set of data subunits comprises: performing a reverse raster scanning process on the set of data subunits based on the first data order and the second data order, wherein the reverse raster scanning process associated with the rearrangement of the data is different from the raster scanning process associated with the arrangement of the data.

28. The method of claim 21, wherein each of the set of data subunits includes a plurality of pixels, wherein arranging the data for the set of data subunits comprises:

arranging the plurality of pixels in each of the set of data subunits into the first data order; and the method further comprising:

reading, based on at least one of the encoding process or the decoding process, the data for each data subunit of the set of data subunits.

29. An apparatus for data processing, comprising:

means for obtaining an indication of a set of data subunits corresponding to at least one data unit, wherein the set of data subunits is associated with a bandwidth compression process;

means for arranging data for the set of data subunits into a first data order for the set of data subunits;

means for performing, based on the first data order, at least one of an encoding process on the data for each data subunit of the set of data subunits or a decoding process on the data for each data subunit of the set of data subunits; and means for rearranging the data for the set of data subunits into the first data order for a first data subunit in the set of data subunits and into a second data order for at least one second data subunit in the set of data subunits, wherein the first data order is different from the second data order.

* * * * *